(12) United States Patent
Araki et al.

(10) Patent No.: US 11,335,481 B2
(45) Date of Patent: May 17, 2022

(54) OXIDE SUPERCONDUCTOR AND METHOD FOR MANUFACTURING THE SAME

(71) Applicant: Kabushiki Kaisha Toshiba, Minato-ku (JP)

(72) Inventors: Takeshi Araki, Koto (JP); Hirotaka Ishii, Kawasaki (JP); Nao Kobayashi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 251 days.

(21) Appl. No.: 16/863,344

(22) Filed: Apr. 30, 2020

(65) Prior Publication Data

US 2020/0265975 A1    Aug. 20, 2020

Related U.S. Application Data

(62) Division of application No. 15/438,018, filed on Feb. 21, 2017, now Pat. No. 10,679,779.

(30) Foreign Application Priority Data

Aug. 10, 2016   (JP) .................. 2016-157152

(51) Int. Cl.
*H01F 1/053* (2006.01)
*H01L 39/14* (2006.01)
(Continued)

(52) U.S. Cl.
CPC ......... *H01F 1/053* (2013.01); *C04B 35/4508* (2013.01); *C04B 35/624* (2013.01);
(Continued)

(58) Field of Classification Search
CPC ............................ H01F 6/06; C04B 35/4508
See application file for complete search history.

(56) References Cited

U.S. PATENT DOCUMENTS

2006/0058195 A1   3/2006   Araki et al.
2009/0270263 A1   10/2009  Aoki et al.
(Continued)

FOREIGN PATENT DOCUMENTS

EP   2 055 677   5/2009
EP   2 704 224   3/2014
(Continued)

OTHER PUBLICATIONS

T. Araki, et al., "Review of a chemical approach to YBa2Cu3O7-x-coated superconductors-metalorganic deposition using trifluoroacetates", Supercond. Sci. Technol. 16 (2003) R71-R94.
(Continued)

*Primary Examiner* — Paul A Wartalowicz
(74) *Attorney, Agent, or Firm* — Oblon, McClelland, Maier & Neustadt, L.L.P.

(57) ABSTRACT

An oxide superconductor of an embodiment includes an oxide superconductor layer having a continuous Perovskite structure containing rare earth elements, barium (Ba), and copper (Cu). The rare earth elements contain a first element which is praseodymium (Pr), at least one second element selected from the group consisting of neodymium (Nd), samarium (Sm), europium (Eu), and gadolinium (Gd), at least one third element selected from the group consisting of yttrium (Y), terbium (Tb), dysprosium (Dy), and holmium (Ho), and at least one fourth element selected from the group consisting of erbium (Er), thulium (Tm), ytterbium (Yb), and lutetium (Lu).

2 Claims, 11 Drawing Sheets

(51) Int. Cl.
H01L 39/24 (2006.01)
H01L 39/12 (2006.01)
C04B 35/45 (2006.01)
C04B 35/622 (2006.01)
C04B 35/624 (2006.01)
C04B 35/626 (2006.01)
C04B 35/64 (2006.01)
C23C 18/12 (2006.01)
H01F 6/06 (2006.01)

(52) U.S. Cl.
CPC .... C04B 35/6264 (2013.01); C04B 35/62222 (2013.01); C04B 35/64 (2013.01); C23C 18/1216 (2013.01); C23C 18/1241 (2013.01); C23C 18/1254 (2013.01); C23C 18/1295 (2013.01); H01F 6/06 (2013.01); H01L 39/126 (2013.01); H01L 39/143 (2013.01); H01L 39/2425 (2013.01); *C04B 2235/3215* (2013.01); *C04B 2235/3224* (2013.01); *C04B 2235/3225* (2013.01); *C04B 2235/3282* (2013.01); *C04B 2235/449* (2013.01); *C04B 2235/656* (2013.01); *C04B 2235/6584* (2013.01); *C04B 2235/6585* (2013.01); *C04B 2235/6588* (2013.01); *C04B 2235/663* (2013.01); *C04B 2235/768* (2013.01); *C04B 2235/79* (2013.01); *C04B 2235/80* (2013.01); *C04B 2235/81* (2013.01)

(56) References Cited

U.S. PATENT DOCUMENTS

2014/0066311 A1 3/2014 Araki et al.
2017/0309805 A1 10/2017 Araki et al.
2018/0197659 A1 7/2018 Hayashi et al.

FOREIGN PATENT DOCUMENTS

JP 2017-057114 3/2017
WO WO2017/145401 8/2017

OTHER PUBLICATIONS

M. W. Rupich, et al., "Advances in second generation high temperature superconducting wire manufacturing and R&D at American Superconductor Corporation", Supercond. Sci. Technol. 23 (2010) 014015 (9pp).

P. Mele, et al., "Incorporation of double artificial pinning centers in YBa2Cu3O7-δ films", Physica C, 468 (2008) 1631-1634.

OXIDE SUPERCONDUCTOR AND METHOD FOR MANUFACTURING THE SAME

CROSS-REFERENCE TO RELATED APPLICATION

This application is a Divisional of U.S. application Ser. No. 15/438,018 filed on Feb. 21, 2017.

This application is based upon and claims the benefit of priority from Japanese Patent Application No. 2016-157152, filed on Aug. 10, 2016, the entire contents of which are incorporated herein by reference.

FIELD

Embodiments described herein relate generally to an oxide superconductor and a method for manufacturing the same.

BACKGROUND

Superconduction is a phenomenon to make a resistance value completely zero, which was found using mercury by Dutch Kamerring Onnes who developed a freezer. Subsequently, a superconducting transition temperature (Tc) was defined as 39 K by Bardeen Cooper Schrieffer (BCS) theory, but this was Tc of a first type superconductor.

In a second type superconductor found by Bednorz or the like in 1986, a result better than 39 K was indicated, leading to development of an oxide superconductor which can be used at a liquid nitrogen temperature. The oxide superconductor is a second type superconductor in which a superconducting state and a non-superconducting state are mixed. At present, many high temperature oxide superconductors which can be used at a liquid nitrogen temperature are on sale in a lot of 500 m. Application of a superconducting wire is expected to various large apparatuses such as a superconducting power transmission cable, a nuclear fusion furnace, a magnetically levitated train, a particle accelerator, and a magnetic diagnostic apparatus (MRI).

Typical examples of a developed high temperature oxide superconductor include a bismuth-based superconducting wire called a first generation and an yttrium-based superconducting wire called a second generation. Manufacturing withdrawal of the first generation requiring silver in an amount of 60% by volume or more has occurred successively, and extremely a few companies manufacture the first generation now in the world.

On the other hand, a total sold wire length of the second generation in which a substrate is inexpensive and a physical strength is excellent is more than 3,000 km. A 50 MVA DC power transmission cable system manufactured using a large amount of wire materials had an operation achievement result of three years or more at the point of August 2015. Since September 2014, a DC power transmission cable system having a capacity of 500 MVA has been operated. A power transmission capacity of 500 MVA corresponds to power of approximately 50% of a standard nuclear reactor.

The wire material has been sold in a total length of 3,000 km or more. A large contract of 20 km or more in a wire length, delivery thereof, and an application achievement result thereof all used wire materials manufactured by a metal organic deposition using trifluoroacetates (TFA-MOD) method. The TFA-MOD method is a first manufacturing method which manufactures a wire material having a length of 500 m stably, can supply the wire material in a large amount, and has an application achievement result.

Typical examples of another second generation manufacturing method include a pulsed laser deposition (PLD) method and a metal organic chemical vapor deposition (MOCVD) method. However, both of the methods have a problem in composition control, and have not achieved stable mass production of a wire material having a length of 500 m at present. Therefore, at present, the wire material manufactured by the TFA-MOD method has a wire material share of approximately 100%.

This fact does not deny future of the PLD method or the MOCVD method. A manufacturing method using physical deposition has difficulty in composition control. However, if a technique capable of controlling three kinds of elements flying in vacuum and having a difference of twice or more relative to one another in an atomic weight so as to have a composition difference of 1% or less at almost the same level as the TFA-MOD method using an inexpensive method is developed, mass production is possible. However, this problem has not been solved for 28 years or more since 1987.

Meanwhile, wire materials manufactured by the PLD method or the MOCVD method are leading in coil application requiring a magnetic field characteristic. This is because an artificial pin required for improving a magnetic field characteristic is easily introduced. However, a coil manufactured by using a superconducting wire manufactured by the PLD method or the MOCVD method has no achievement result at present. The manufacturing number thereof is considered to be 20 to 30. However, it does not seem that completion of a satisfactory coil has been reported.

DETAILED DESCRIPTION

Figure 1A:
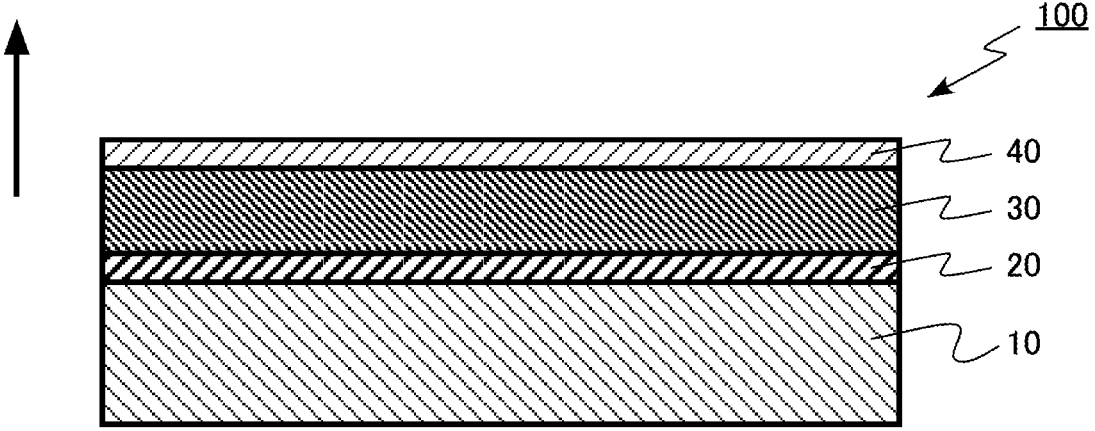
FIGS. 1A and 1B are schematic cross-sectional views of an oxide superconductor of a first embodiment.

An oxide superconductor of an embodiment includes an oxide superconductor layer having a continuous Perovskite structure including rare earth elements, barium (Ba), and copper (Cu), the rare earth elements including a first element, at least one second element, at least one third element, and at least one fourth element, the first element being praseodymium (Pr), the at least one second element being selected from the group consisting of neodymium (Nd), samarium (Sm), europium (Eu), and gadolinium (Gd), the at least one third element being selected from the group consisting of yttrium (Y), terbium (Tb), dysprosium (Dy), and holmium (Ho), and the at least one fourth element being selected from the group consisting of erbium (Er), thulium (Tm), ytterbium (Yb), and lutetium (Lu).

Here, a crystallographically continuous structure is assumed to be a "single crystal". A crystal having a low inclination angle grain boundary having a difference of 1.0 degree or less in a c-axis direction is also assumed to be a "single crystal".

Here, a pinning atom (PA) is a rare earth element acting as an artificial pin of an oxide superconductor layer. PA forms a non-superconducting unit cell. Only praseodymium (Pr) is used for PA.

Here, a supporting atom (SA) is a rare earth element for promoting clustering of an artificial pin. A trivalent ionic radius of SA is smaller than a trivalent ionic radius of PA, and is larger than a trivalent ionic radius of MA described below.

Here, a matrix atom (MA) is a rare earth element for forming a matrix phase of an oxide superconductor layer.

Here, a counter atom (CA) is a rare earth element for forming a cluster with PA or SA. A trivalent ionic radius of CA is smaller than a trivalent ionic radius of MA.

Here, a first generation type atom-replaced artificial pin (first ARP: 1st-Atom Replaced Pin) means an artificial pin in which a non-superconducting unit cell containing PA is ultimately dispersed in a matrix phase of a superconducting unit cell containing MA. Ultimate dispersion is a form in which a non-superconducting unit cell is present alone in a matrix phase.

Here, a second generation type clustered atom-replaced artificial pin (second CARP: 2nd-Clustered Atom Replaced Pin) means an artificial pin in which a unit cell containing PA, a unit cell containing SA, and a unit cell containing CA are clustered in a matrix phase of a superconducting unit cell containing MA. The second CARP has a larger artificial pin size than the first ARP.

Here, a third generation type clustered atom-replaced artificial pin (third CARP: 3rd-Clustered Atom Replaced Pin) means an artificial pin in which a unit cell containing PA and a unit cell containing CA are clustered in a matrix phase of a superconducting unit cell containing MA. The third CARP is different from the second CARP in containing no SA.

Hereinafter, an oxide superconductor of an embodiment is described with reference to the drawings.

First Embodiment

An oxide superconductor of the present embodiment includes an oxide superconductor layer having a continuous Perovskite structure containing rare earth elements, barium (Ba), and copper (Cu). The rare earth elements contain a first element which is praseodymium (Pr), at least one second element selected from the group consisting of neodymium (Nd), samarium (Sm), europium (Eu), and gadolinium (Gd), at least one third element selected from the group consisting of yttrium (Y), terbium (Tb), dysprosium (Dy), and holmium (Ho), and at least one fourth element selected from the group consisting of erbium (Er), thulium (Tm), ytterbium (Yb), and lutetium (Lu).

Figure 1B:
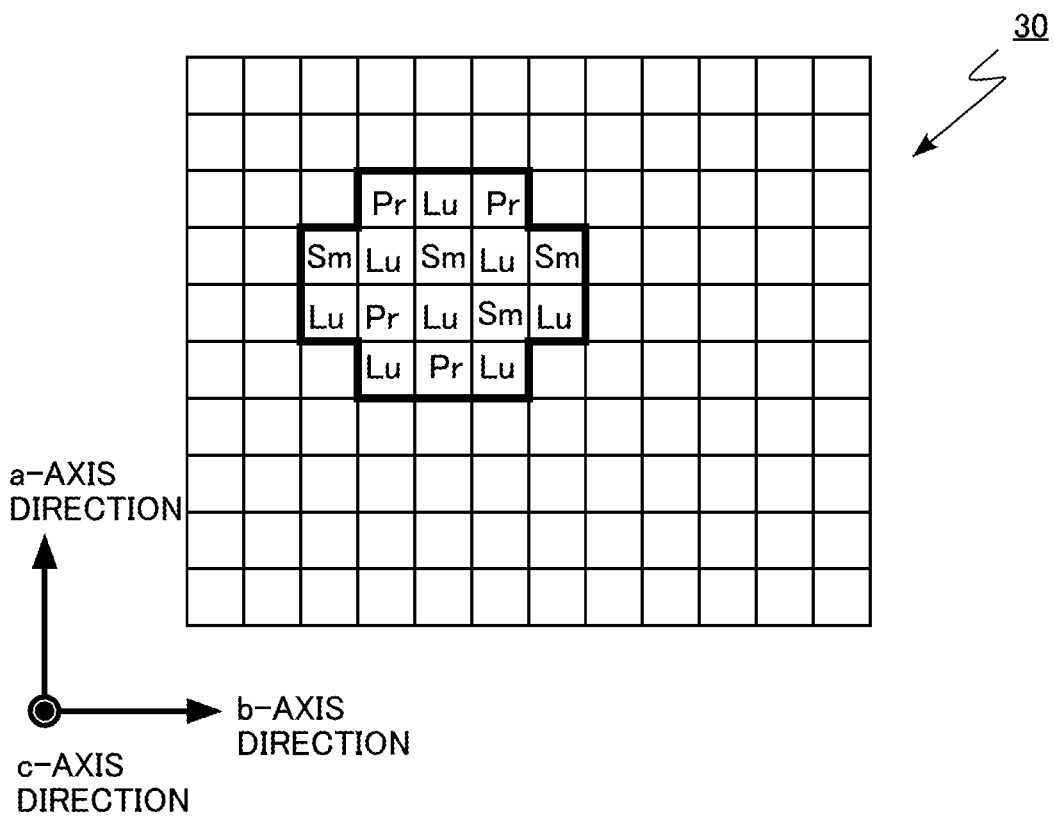

FIGS. 1A and 1B are schematic cross-sectional views of the oxide superconductor of the present embodiment. FIG. 1A is an entire view, and FIG. 1B is an enlarged schematic cross-sectional view of an oxide superconductor layer.

The oxide superconductor of the present embodiment is a superconducting wire. The oxide superconductor of the present embodiment is suitable for an application under a condition in which a magnetic field is applied, for example, for a superconducting coil, a superconducting magnet, an MRI apparatus, a magnetically levitated train, or a superconducting magnetic energy storage (SMES). The oxide superconductor of the present embodiment can be also applied to a power transmission cable under a condition in which a magnetic field is applied.

As illustrated in FIG. 1A, an oxide superconductor 100 includes a substrate 10, an intermediate layer 20, an oxide superconductor layer 30, and a metal layer 40. The substrate 10 increases a mechanical strength of the oxide superconductor layer 30. The intermediate layer 20 is a so-called oriented intermediate layer. The intermediate layer 20 is provided in order to orient the oxide superconductor layer 30 to obtain a single crystal when a film of the oxide superconductor layer 30 is formed. The metal layer 40 is a so-called stabilizing layer. The metal layer 40 protects the oxide superconductor layer 30. In addition, the metal layer 40 stabilizes the oxide superconductor 100 by causing a bypass current even when a superconducting state becomes partially unstable during actual use of the oxide superconductor 100 as a superconducting wire.

For example, the substrate 10 is formed of a metal such as a nickel-tungsten alloy. For example, the intermediate layer 20 is formed of yttrium oxide ($Y_2O_3$), yttria stabilized zirconia (YSZ), and cerium oxide ($CeO_2$) from the substrate 10 side. For example, a layer structure of the substrate 10 and the intermediate layer 20 is nickel-tungsten alloy/yttrium oxide/yttria stabilized zirconia/cerium oxide. In this case, the oxide superconductor layer 30 is formed on cerium oxide.

For example, the substrate 10 may be a single crystal layer lattice-matching with the oxide superconductor layer 30. For example, the single crystal layer is formed of lanthanum aluminate ($LaAlO_3$, hereinafter, also referred to as LAO). In this case, the intermediate layer 20 can be omitted.

As the substrate 10 and the intermediate layer 20, for example, an ion beam assisted deposition (IBAD) substrate can be used. When the IBAD substrate is used, the substrate 10 is a non-oriented layer. The intermediate layer 20 is, for example, formed of a five-layer structure. For example, lower two layers are non-oriented layers, an oriented source layer is formed thereon by an IBAD method, and two metal oxide oriented layers are formed thereon. In this case, the uppermost oriented layer lattice-matches with the oxide superconductor layer 30.

The oxide superconductor layer 30 has a continuous Perovskite structure containing a rare earth element, barium (Ba), and copper (Cu). The rare earth elements contain a first element which is praseodymium (Pr), at least one second element selected from the group consisting of neodymium (Nd), samarium (Sm), europium (Eu), and gadolinium (Gd), at least one third element selected from the group consisting of yttrium (Y), terbium (Tb), dysprosium (Dy), and holmium (Ho), and at least one fourth element selected from the group consisting of erbium (Er), thulium (Tm), ytterbium (Yb), and lutetium (Lu).

Hereinafter, the first element is referred to as a pinning atom (PA), the second element is referred to as a supporting atom (SA), the third element is referred to as a matrix atom (MA), and the fourth element is referred to as a counter atom (CA).

The oxide superconductor layer 30 in the present embodiment contains a second generation type clustered atom-replaced artificial pin (second CARP: 2nd-Clustered Atom Replaced Pin).

The kind of rare earth elements contained in the oxide superconductor layer 30 can be identified using secondary ion mass spectrometry (SIMS).

The oxide superconductor layer 30 is formed of a single crystal having a continuous Perovskite structure. For example, the Perovskite structure is described by $REBa_2Cu_3O_{7-y}$ ($-0.2 \leq y \leq 1$) (hereinafter, REBCO). RE is a rare earth site.

For example, the layer thickness of the oxide superconductor layer 30 is 0.1 μm or more and 10 μm or less. For example, the oxide superconductor layer 30 is formed of a single crystal in an entire layer thickness direction.

For example, the single crystal is present in a range of 50 nm or more from the substrate 10 side of the oxide superconductor layer 30 and 70% or less of an average layer thickness of the oxide superconductor layer 30 in the oxide superconductor layer 30. For example, the single crystal has a size of 500 nm×100 nm or more in a cross section of the oxide superconductor layer 30 in a layer thickness direction thereof.

For example, the oxide superconductor layer 30 contains fluorine of $2.0 \times 10^{15}$ atoms/cc or more and $5.0 \times 10^{19}$ atoms/cc or less and carbon of $1.0 \times 10^{17}$ atoms/cc or more and $5.0 \times 10^{20}$ atoms/cc or less. The fluorine and carbon contained in the oxide superconductor layer 30 are residual elements caused by forming a film of the oxide superconductor layer 30 by the TFA-MOD method. For example, the fluorine and carbon in the oxide superconductor layer 30 are present in a grain boundary of a single crystal.

For example, the fluorine contained in the oxide superconductor layer 30 has a concentration of $2.0 \times 10^{16}$ atoms/cc or more. For example, the carbon contained in the oxide superconductor layer 30 has a concentration of $1.0 \times 10^{18}$ atoms/cc or more.

For example, the concentration of each of the fluorine and carbon in the oxide superconductor layer 30 can be measured using SIMS.

For example, the metal layer 40 is formed of a metal containing silver (Ag) or copper (Cu) as a base material, and may be an alloy. The metal layer 40 may contain a small amount of precious metal such as gold (Au).

FIG. 1B is an enlarged schematic cross-sectional view of the oxide superconductor layer 30, viewed from above a film thereof, that is, from a direction of the c-axis thereof. Each square indicates a unit cell in a single crystal.

FIG. 1B illustrates a case where PA is praseodymium (Pr), SA is samarium (Sm), MA is yttrium (Y), and CA is lutetium (Lu). The oxide superconductor layer 30 is formed of a PBCO unit cell containing praseodymium (Pr), a SmBCO unit cell containing samarium (Sm), a YBCO unit cell containing yttrium (Y), and a LuBCO unit cell containing lutetium (Lu).

Squares indicating unit cells of PrBCO, SmBCO, and LuBCO are represented by Pr, Sm, and Lu, respectively. A hollow square in FIG. 1B indicates a YBCO unit cell as a matrix phase.

The unit cells of PrBCO, SmBCO, and LuBCO form an assembly in YBCO as a matrix phase in the oxide superconductor layer 30. This assembly is referred to as a cluster. In FIG. 1B, an area surrounded by a bold solid line indicates a cluster.

PrBCO is a non-superconductor. A cluster containing PrBCO acts as an artificial pin of the oxide superconductor layer 30.

A relationship of a trivalent ionic radius among praseodymium (Pr), samarium (Sm), yttrium (Y), and lutetium (Lu) satisfies Pr>Sm>Y>Lu. In a cluster, PrBCO and SmBCO each containing a rare earth element larger than YBCO as a matrix phase and LuBCO containing a rare earth element smaller than YBCO are assembled. Hereinafter, a unit cell containing a rare earth element larger than a matrix phase is referred to as a large unit cell, and a unit cell containing a rare earth element smaller than a matrix phase is referred to as a small unit cell.

A unit cell containing MA is a matrix phase. The content of MA is the largest among the contents of rare earth elements contained in the oxide superconductor layer 30. For example, when the number of atoms of rare earth elements is N(RE), and the number of atoms of MA as the third element is N(MA), N(MA)/N(RE)≥0.6 is satisfied. In other words, a molar ratio of MA in rare earth elements contained in the oxide superconductor layer 30 is 0.6 or more.

For example, a quantitative ratio of the number of atoms of a rare earth element or the number of moles thereof in the oxide superconductor layer 30 can be calculated based on a result of concentration measurement of an element using SIMS.

Figure 2:
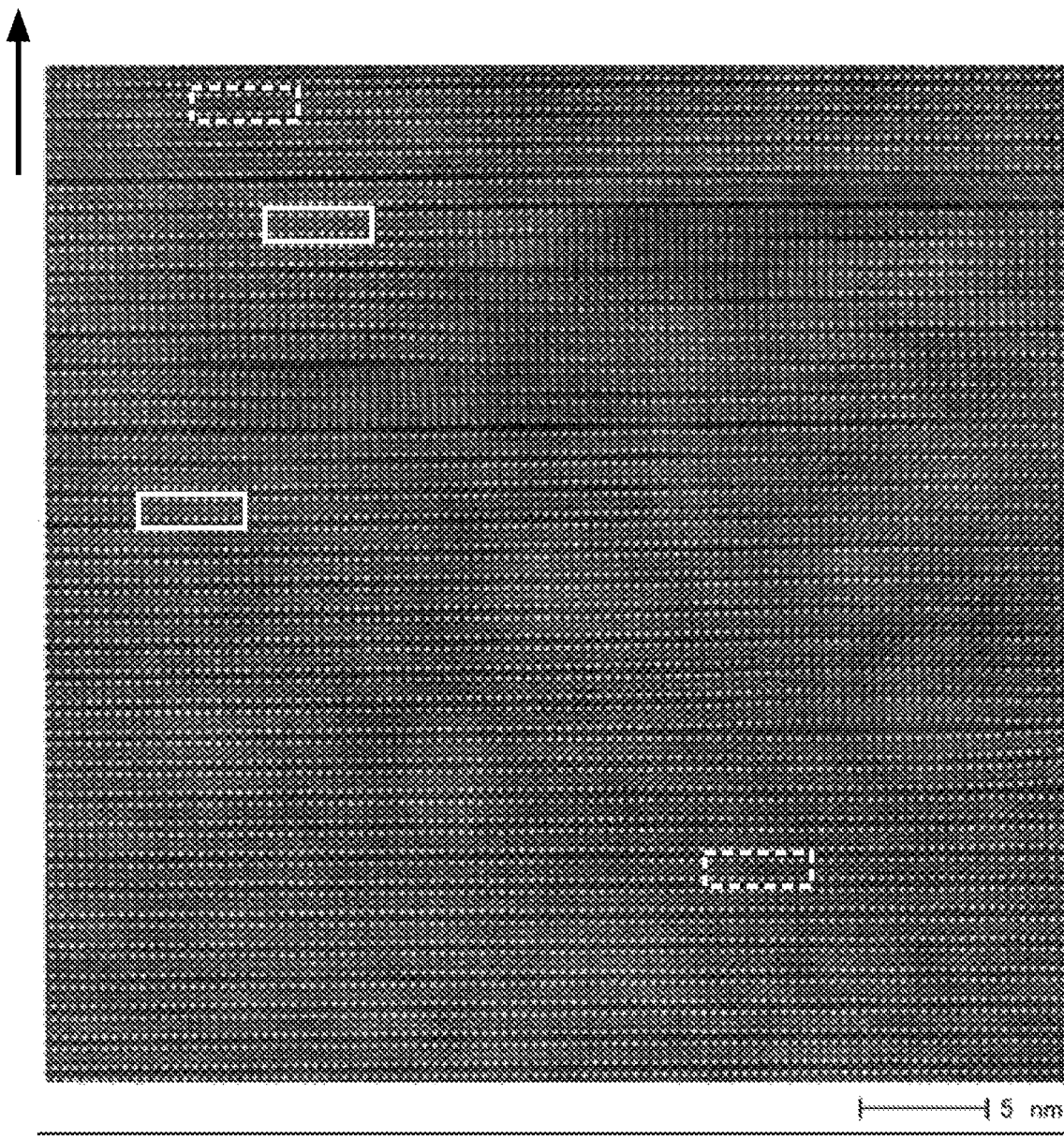
FIG. 2 is a transmission electron microscopy image of the oxide superconductor of the first embodiment.

FIG. 2 is a transmission electron microscopy (TEM) image of the oxide superconductor layer 30 in the present embodiment. More specifically, FIG. 2 is a high-angle annular dark field scanning TEM (HAADF-STEM) image.

The image is an observed image at a magnification of 4000000. FIG. 2 is a cross section in a layer thickness direction of the oxide superconductor layer 30, that is, in a direction parallel to the c-axis. FIG. 2 is a cross-sectional view of a sample in which the numbers of atoms of praseodymium (Pr), samarium (Sm), and lutetium (Lu) are 4%, 4%, and 8%, respectively when the number of atoms of rare earth elements in the oxide superconductor layer 30 is assumed to be 100%.

From the observed image in FIG. 2, an oriented Perovskite structure at an atomic level can be confirmed. It is found that there is no different phase in the oxide superconductor layer 30 but unit cells having the same lattice constant are arranged. In other words, the oxide superconductor layer 30 in FIG. 2 is formed of a single crystal having a Perovskite structure.

In FIG. 2, all the single crystals have a Perovskite structure in a layer thickness direction. A single crystal has a size of 500 nm×100 nm or more.

In FIG. 2, an area indicated by a white solid line frame is a cluster. Among atoms arranged in three rows in a horizontal direction in the white solid line frame, atoms in two rows upper and lower are in a barium (Ba) site. Atoms in an intermediate row therebetween are in a rare earth site.

Also in an area indicated by a white broken line frame, similarly, among atoms arranged in three rows in a horizontal direction, atoms in two rows upper and lower are in a barium (Ba) site, and atoms in an intermediate row therebetween are in a rare earth site. The atoms in the rare earth site in the area indicated by the white solid line frame are brighter than the atoms in the rare earth site in the area indicated by the white broken line frame.

In a HAADF-STEM image, an element having a larger atomic weight emits light more brightly. The area indicated by the white solid line frame contains praseodymium (Pr), samarium (Sm), and lutetium (Lu) each having a larger atomic weight than yttrium (Y), and therefore is considered to be brighter than the area indicated by the white broken line frame.

For example, in the HAADF-STEM image of the oxide superconductor layer 30, when brightness of barium is represented by I(Ba) and brightness of an rare earth element sandwiched by barium is represented by I(RE), a first area and a second area satisfying that I(RE)/I(Ba) in the first area is 1.3 times or more I(RE)/I(Ba) in the second area are present. The first area is a cluster.

For example, as illustrated in FIG. 2, each of the first area and the second area is an area containing 10 atoms in a rare earth site arranged in one row in a horizontal direction and 10 atoms in a barium site in each of two rows upper and lower, sandwiching the rare earth site. In FIG. 2, the white solid line frame indicates the first area, and the white broken line frame indicates the second area.

As the TEM image in FIG. 2 indicates, lattice distortion is generated in a barium site, and it is considered that the degree of the distortion is more than one degree. However, as FIG. 2 indicates, a gap between atoms adjacent to each other is clearly almost constant, and it can be assumed that a bonding as a crystal is present. Therefore, the structure in FIG. 2 is defined as a single crystal.

Figure 3A:
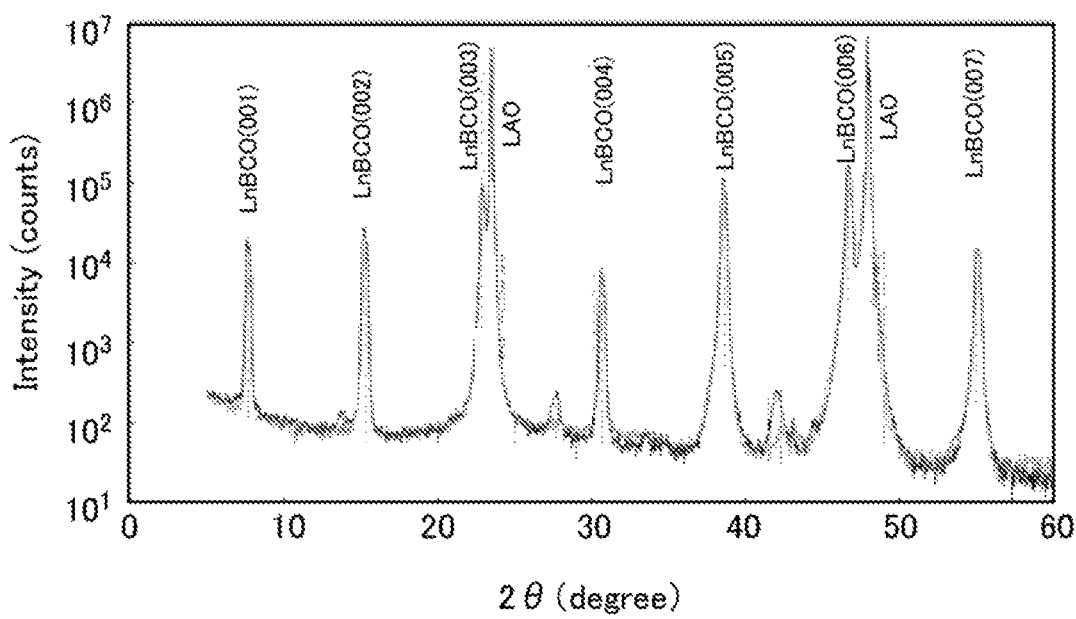
FIGS. 3A and 3B are diagrams illustrating a result of X-ray diffraction measurement of the oxide superconductor layer of the first embodiment.
Figure 3B:
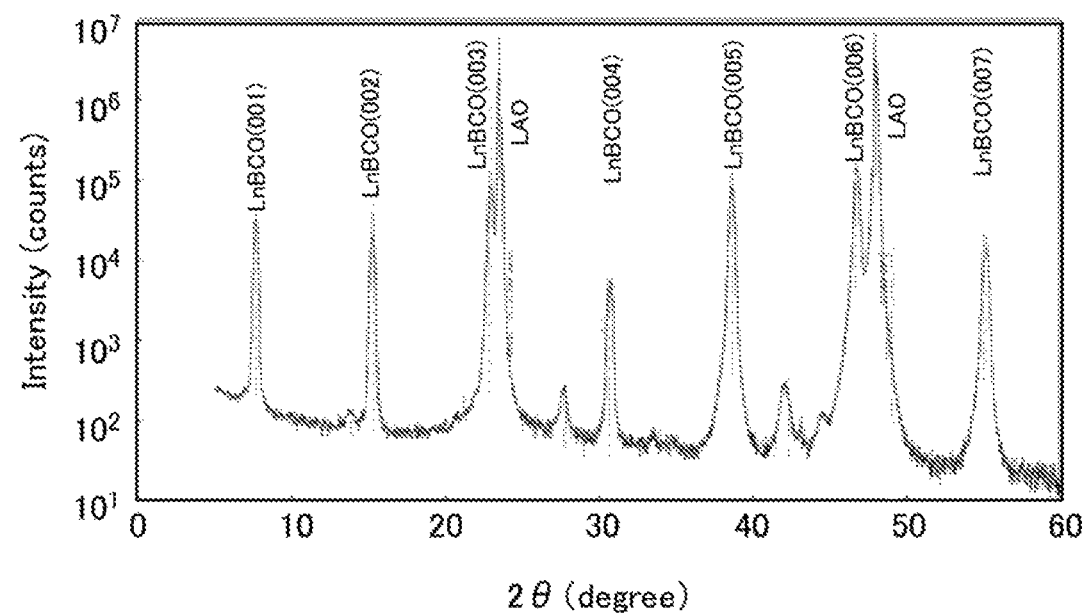

FIGS. 3A and 3B are diagrams illustrating a result of X-ray diffraction (XRD) measurement of the oxide superconductor layer 30 in the present embodiment. The oxide superconductor layer 30 was measured by a 2θ/ω method in XRD measurement.

FIG. 3A illustrates a result of measurement of a sample of YBCO containing no rare earth element other than yttrium, and a sample in which the contents of praseodymium, samarium, yttrium, and lutetium in the rare earth element are 4%, 4%, 84%, and 8%, respectively. FIG. 3B illustrates a result of measurement of a sample in which the contents of praseodymium, samarium, yttrium, and lutetium in the rare earth element are 1%, 1%, 96%, and 2%, respectively, and a sample in which the contents of praseodymium, samarium, yttrium, and lutetium in the rare earth element are 2%, 2%, 92%, and 4%, respectively.

In FIG. 3A, peaks of the sample containing praseodymium, samarium, and lutetium coincide with those of YBCO, and any other clear peaks are not confirmed. Separation of a peak is not observed even in the sample containing praseodymium, samarium, and lutetium. Therefore, it is found that the sample containing praseodymium, samarium, and lutetium is also formed of a single crystal having a continuous Perovskite structure.

In FIG. 3B, separation of a peak is not observed. Therefore, it is found that the sample containing praseodymium, samarium, and lutetium is formed of a single crystal having a continuous Perovskite structure.

In FIGS. 3A and 3B, a peak of LAO used for a substrate also appears.

Next, a method for manufacturing the oxide superconductor 100 of the present embodiment will be described. The intermediate layer 20 is formed on the substrate 10, the oxide superconductor layer 30 is formed on the intermediate layer 20, and the metal layer 40 is formed on the oxide superconductor layer 30. The oxide superconductor layer 30 is formed by the TFA-MOD method.

In formation of the oxide superconductor layer 30, first, an aqueous solution containing an acetate of a first element which is praseodymium (Pr), an acetate of at least one second element selected from the group consisting of neodymium (Nd), samarium (Sm), europium (Eu), and gadolinium (Gd), an acetate of at least one third element selected from the group consisting of yttrium (Y), terbium (Tb), dysprosium (Dy), and holmium (Ho), and an acetate of at least one fourth element selected from the group consisting of erbium (Er), thulium (Tm), ytterbium (Yb), and lutetium (Lu), an acetate of barium (Ba), and an acetate of copper (Cu) is prepared. Subsequently, the aqueous solution is mixed with a perfluorocarboxylic acid mainly containing trifluoroacetic acid to prepare a mixed solution, and the mixed solution is subjected to a reaction and purification to prepare a first gel. Subsequently, an alcohol containing methanol is added to the first gel and is dissolved therein to prepare an alcohol solution, and the alcohol solution is subjected to a reaction and purification to prepare a second gel. Subsequently, an alcohol containing methanol is added to the second gel and is dissolved therein to prepare a coating solution in which a total weight of residual water and residual acetic acid is 2% by weight or less, and the coating solution is applied on a substrate to form a gel film. Subsequently, the gel film is subjected to calcining at 400° C. or lower to form a calcined film. Subsequently, the calcined film is subjected to firing under a humidified atmosphere at 725° C. or higher and 850° C. or lower and oxygen annealing to form the oxide superconductor layer (oxide superconductor film) 30.

The perfluorocarboxylic acid desirably contains 98 mol % or more trifluoroacetic acid from a viewpoint of preventing reduction of a superconducting characteristic.

Figure 4:
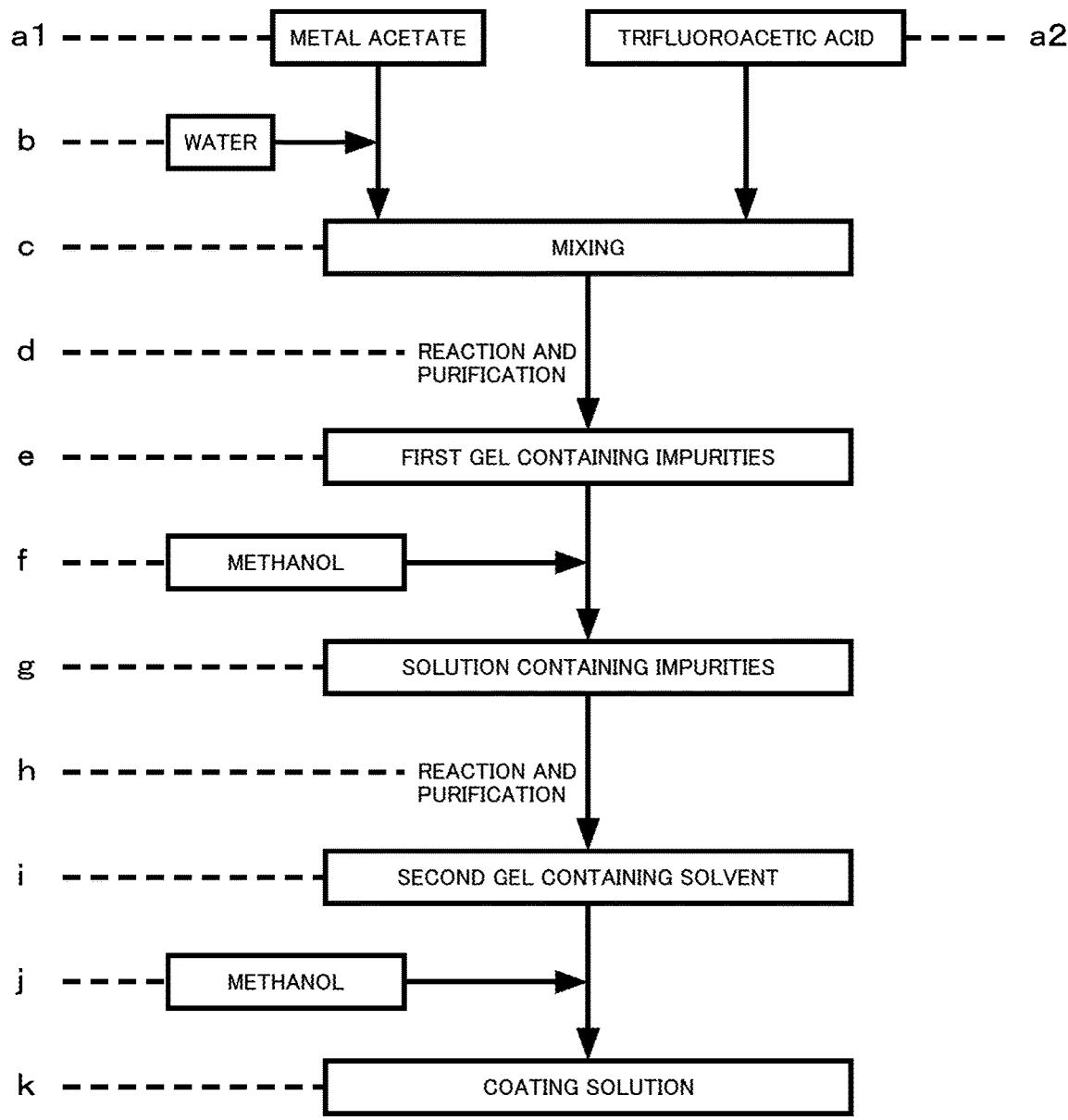
FIG. 4 is a flowchart exemplifying preparation of a coating solution in the first embodiment.

FIG. 4 is a flowchart exemplifying preparation of a coating solution in the present embodiment. Hereinafter, a case where PA as the first element is praseodymium (Pr), SA as the second element is samarium (Sm), MA as the third element is yttrium (Y), and CA as the fourth element is lutetium (Lu) is exemplified.

As illustrated in FIG. 4, a metal acetate of each of yttrium, praseodymium, samarium, lutetium, barium, and copper is prepared (a1). Trifluoroacetic acid is prepared (a2). Subsequently, the prepared metal acetate is dissolved in water (b), and is mixed with the prepared trifluoroacetic acid (c). The obtained solution is subjected to a reaction and purification (d) to obtain a first gel containing impurities (e). Subsequently, the obtained first gel is dissolved in methanol (f) to prepare a solution containing impurities (g). The obtained solution is subjected to a reaction and purification, and impurities are removed (h) to obtain a second gel containing a solvent (i). Furthermore, the obtained second gel is dissolved in methanol (j) to prepare a coating solution (k).

As a metal acetate, metal salts are mixed at RE site (Y, Pr, Sm, Lu):Ba:Cu=1:2:3. Mixing is performed such that the content of Pr in the RE site is 0.00000001 or more and 0.20 or less. After mixing and the reaction, the total content of the residual water and acetic acid in the coating solution is reduced to 2 wt % or less by a high purity solution purifying process using a stabilized solvent-into-gel (SIG) method. The SIG method in the present embodiment is a method for highly purifying a solution to be partially stabilized for preventing decomposition of PrBCO, and is a partially stabilized solvent-into-gel (PS-SIG) method. For example, mixing is performed such that a value of Pr/(Y+Pr+Sm+Lu) is 0.0025.

Figure 5:
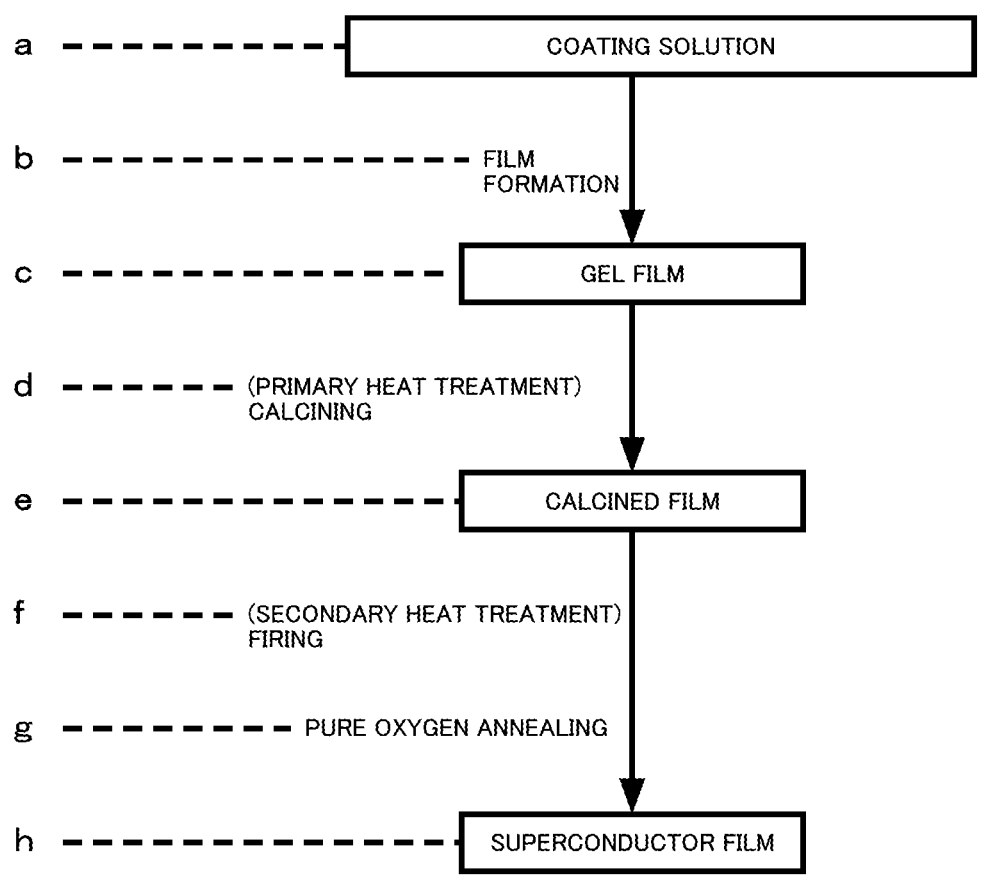
FIG. 5 is a flowchart exemplifying a method for forming a film of a superconductor from the coating solution in the first embodiment.

FIG. 5 is a flowchart exemplifying a method for forming a film of a superconductor from the coating solution in the present embodiment.

As illustrated in FIG. 5, first, the coating solution prepared in advance is prepared (a). For example, a film is formed by applying the coating solution on a substrate by a die coating method (b) to obtain a gel film (c). Subsequently, the obtained gel film is subjected to calcining as a primary heat treatment, and an organic substance is decomposed (d) to obtain a calcined film (e). Furthermore, this calcined film is subjected to firing as a secondary heat treatment (f), and then, for example, is subjected to pure oxygen annealing (h) to obtain a superconductor film (h).

Figure 6:
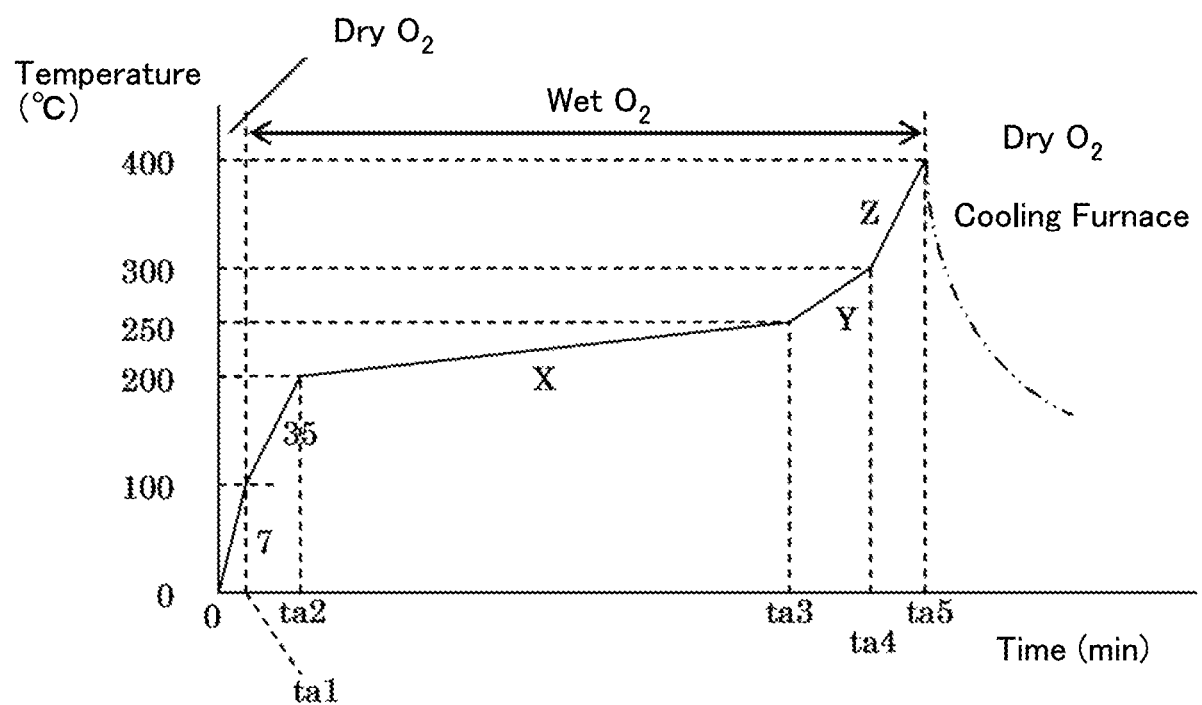
FIG. 6 is a diagram illustrating a typical calcining profile in the first embodiment.

FIG. 6 is a diagram illustrating a typical calcining profile in the present embodiment. Calcining under normal pressure decomposes a trifluoroacetate mainly at 200° C. or higher and 250° C. or lower. In order to prevent the temperature from entering the region, a temperature-rising rate is reduced around 200° C. By gradually raising the temperature to 250° C., a substance decomposed from the trifluoroacetate contains fluorine or oxygen, which easily remains in the film due to a hydrogen bond. The temperature is raised to 400° C. in order to remove the substance. A final temperature is generally from 350 to 450° C. In this way, a semitransparent brown calcined film formed of an oxide or a fluoride is obtained.

Figure 7:
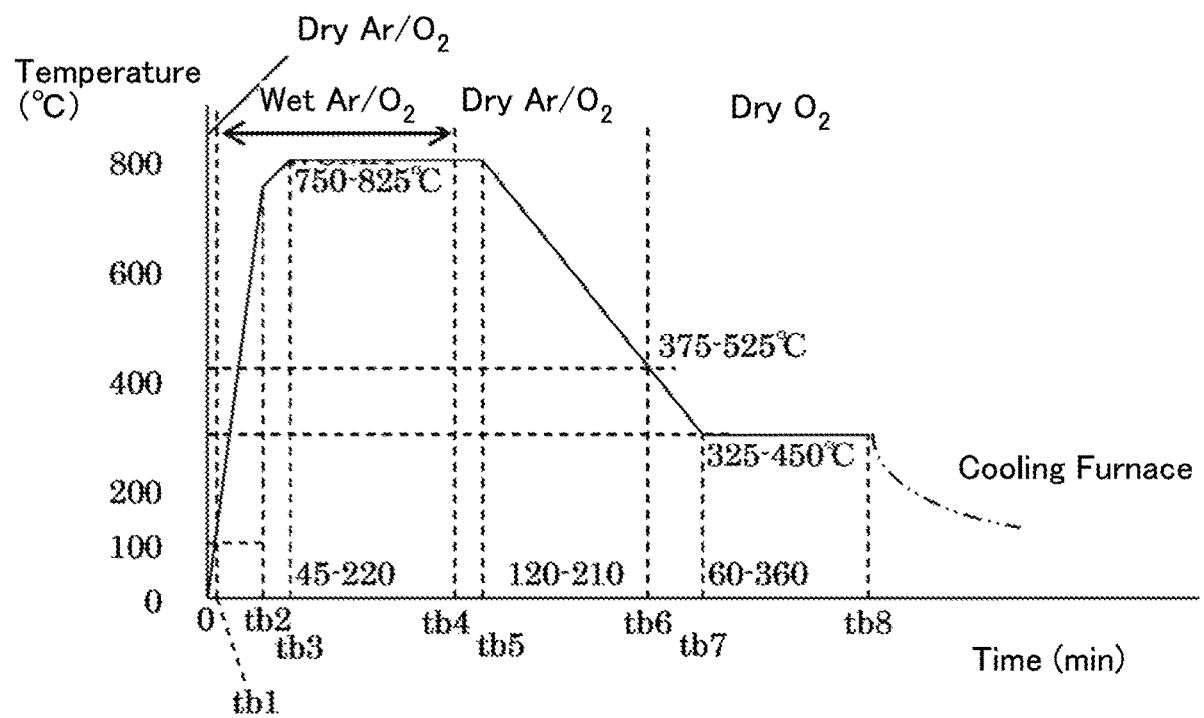
FIG. 7 is a diagram illustrating a typical firing profile in the first embodiment.

FIG. 7 is a diagram illustrating a typical firing profile in the present embodiment. Until tb1 at 100° C., a dry mixed gas is used. However, subsequently, humidification is performed. A humidification starting temperature may be 100° C. or higher and 400° C. or lower. It is considered that formation of a pseudo-liquid layer starts around 550° C. Humidification is performed at a temperature of 550° C. or lower such that a pseudo-liquid layer is uniformly formed while a humidified gas is spread in the film.

FIG. 7 illustrates a typical temperature profile of firing at 800° C. The profile is a gradual temperature-rising profile at 775° C. or higher and 800° C. or lower such that temperature overshoot at tb3 does not occur. Even in this profile, overshoot of 2 to 3° C. may remain at 800° C., but does not cause a particular problem. An oxygen partial pressure at a maximum temperature depends on a matrix phase. In a case of firing of a YBCO superconductor, the optimal oxygen partial pressure is 1000 ppm at 800° C., and becomes half whenever the temperature is lowered by 25° C. therefrom. That is, the optimal oxygen partial pressure is 500 ppm at 775° C., and is 250 ppm at 750° C. In this firing, a YBCO-based material forms $YBa_2Cu_3O_6$. At this time, the YBCO-based material is not a superconductor.

In firing at a maximum temperature, a dry gas is caused to flow at tb4 before the temperature starts to be lowered after completion of firing. A humidified gas decomposes a superconductor to generate an oxide at 700° C. or lower, and therefore oxygen annealing is performed at tb6, and the oxygen number of the superconductor is changed from 6.00 to 6.93. A substance becomes a superconductor at this oxygen number. However, only PrBCO is not a superconductor although having a Perovskite structure. The valence of Pr is unknown, and therefore the oxygen number of a unit cell thereof is also unknown, but Pr is considered to have the large oxygen number. This is because the valence of Pr is between three and four and the oxygen number is increased in accordance therewith in a unit cell. An oxygen annealing starting temperature is 375° C. or higher and 525° C. or lower. Subsequently, the temperature is maintained, and then a furnace is cooled from tb8.

By the above manufacturing method, the oxide superconductor 100 containing the oxide superconductor layer 30 according to the present embodiment is manufactured.

Next, the functions and the effects of the oxide superconductor 100 of the present embodiment are described.

The oxide superconductor 100 of the present embodiment contains YBCO as a matrix phase in the oxide superconductor layer 30. PrBCO as a non-superconductor is clustered together with SmBCO and LuBCO as superconductors in a matrix phase. This cluster acts as an atomic level artificial pin to improve a magnetic field characteristic. According to the method for manufacturing the oxide superconductor 100 of the present embodiment, the oxide superconductor 100 containing the cluster as an artificial pin and having a magnetic field characteristic improved can be manufactured.

The oxide superconductor layer 30 in the present embodiment is formed of PA, SA, MA, and CA. SA and CA cause a clustering phenomenon. PA is incorporated into a cluster as a part of SA, and a clustered atom-replaced artificial pin (CARP: Clustered Atom-Replaced Pin) is formed. This clustered atom-replaced artificial pin improves a magnetic field characteristic.

A reason why a superconducting wire manufactured by a PLD method or a MOCVD method does not work well as an application of a coil has not become clear. However, it is considered that a fact that such a magnetic field as designed cannot be obtained gives an important suggestion. This is a case where a magnetic field of only 70% of a designed value is obtained although a rated current flows in a designed magnetic field when a coils is manufactured. This often occurs in a YBCO wire material containing a $BaZrO_3$ (hereinafter, BZO) artificial pin, and it is considered that this includes some causes.

It is known that a wire material containing a BZO artificial pin, manufactured by a physical deposition method has a non-uniform inside and lowers Tc. Members of a group for manufacturing a wire material to lower Tc say that an actual use temperature is about 30 K, and therefore ΔT is hardly changed even when Tc is lowered to about 89.0 K from 90.7 K which is a maximum value of a high characteristic YBCO because 60.7 K and 59.0 K are obtained as ΔT. However, it is considered that this argument misses a fact that a superconducting wire having Tc lowered has a non-uniform inside, generates an inner bypass current, and generates an excessive voltage during energization.

A fact that Tc is locally lowered in the superconducting wire means that a Jc value is locally lowered relatively. In a superconducting wire containing a BZO artificial pin, BZO itself is non-superconductive. In addition, the superconducting wire material has a Perovskite structure having about 9% lattice mismatch. A gap is formed at a boundary between a BZO formed area and a YBCO area due to a lattice difference from a YBCO superconductor, and Tc or Jc is lowered.

Furthermore, it is said that BZO extracts an oxygen atom from YBCO. The best Jc value is obtained by the number of oxygen atoms of 6.93 in YBCO. When the number is shifted to an upper or lower value, Tc or a Jc value is lowered. A BZO artificial pin at about 7.5% in terms of a volume ratio is often introduced, and micronization into 4 to 6 nm has been successful. However, this indicates that a non-uniform structure is locally formed on an entire surface of a superconducting wire.

When a current flows in a superconducting wire having a Jc value locally lowered, an influence thereof is small in a case where a current value is about 10% of the Jc value, but it is considered that the influence becomes larger as the current value is increased to 30%, 50%, or 100% of the Jc value. This is because it is considered that a bypass current is generated due to locally different current capacities at the time of flowing of a current of about 100% due to locally different Jc values in a superconducting wire having an unstable Tc value. This inner bypass current is referred to as an inner bypass current (IBC).

Even when a wire material to generate IBC at 77 K is cooled to 30 K, IBC may be generated at 10% of a Jc value. In a case where 7.5% BZO is added, there is almost no course for not generating a bypass current, and therefore it is considered that an influence appears. Regarding the local Jc value, it is considered that a magnitude correlation is maintained even after cooling, and a capacity of the Jc value is increased while the order is almost maintained. It is considered that the same order of the Jc capacity is maintained under a condition in which a magnetic field is applied.

In a superconductor having the same configuration, that is, in a material in which a film is formed simultaneously by a physical deposition method and a BZO artificial pin is introduced simultaneously, a curve of a Jc-B-T characteristic is not often reversed largely. A superconductor having a high Jc value at 77 K often has a relatively high Jc value also at 30 K even when a magnetic field is applied. Therefore, a portion having a locally small Jc capacity is formed all the time, a current does not flow in the portion, and a bypass current flows in a portion having a large capacity. This generates IBC. In other words, a superconducting wire having a Tc value lower than 90.7 K which is a maximum value generates more or less IBC.

When IBC is generated, an electromotive force is generated in the superconducting wire, and heat generation or quenching locally occurs easily. When a commercially available wire material containing a 7.5% BZO artificial pin is cut out into 3 cm and measurement is performed under conditions of 50 K and 5 T while a distance between voltage terminals is 1 cm, a significantly large local voltage having a voltage amplitude of 15 µV by energization of 30 A is observed. Normal conduction transition of a superconductor is defined to be 1 µV/cm, and therefore a noise voltage 15 times larger than the value is generated. A mechanism for this generation of a voltage can be described as follows.

IBC is a phenomenon in which a current does not flow straight in a current direction, and can be considered by dividing IBC into a component parallel (P) to a current direction and a component in a direction vertical (V) thereto. For example, it is assumed that IBC flows from the vicinity of an end of a superconducting wire at an angle of 45 degrees toward the opposite end, flows in a reverse direction after reaching the end, meanders again in a current direction of the wire material at an angle of 45 degrees, and returns to the initial end side.

An upper limit of a critical current density of a superconductor is determined. Therefore, when a current of an upper limit value thereof Jcm (Jcmax) flows at an angle of 45 degrees, each of a P component and a V component is 0.71 Jcm. When a current reaches an end, flows in a reverse direction, and flows again at an angle of 45 degrees, each of a P component and a V component is also 0.71 Jcm. However, the V component is canceled due to flowing in a reverse direction, and becomes a very small value as a whole of the superconducting wire. The superconducting wire has a length of 500 m but has a width of only 4 mm. Therefore, even when the V component is tried to be increased, the width is very small with respect to the length, and therefore the V component is negligibly small.

However, a current of the P component flows in an amount of only 0.71 Jcm. Therefore, a generated magnetic field is 0.71 times a designed value. It is considered that only a magnetic field smaller than a designed magnetic field is formed because the P component is reduced by IBC. This reduced portion (29%) is referred to as an index of IBC (II), and is described as II=−0.29.

The above IBC has another influence. When 0.71 Jcm of a V component is present at an end of start, and reverse occurs by becoming a reverse type, −0.71 Jcm of a V component is present. These two V components have a distance from each other. Therefore, a local magnetic field is generated, a portion where an influence thereof is increased appears, and a local and regular Jc value is further reduced.

It is assumed that a current path CP1 is formed by initial energization in a superconducting wire including IBC. A V component is present due to presence of IBC, and a part of the current path CP1 is shielded by a local magnetic field. A current path CP2 is thereby generated, and it is considered that an electromotive force is generated due to electromagnetic induction or the like by change in a current path.

However, an initially-formed local magnetic field is not formed in the path CP2. The path in which a current path has been formed by initial energization is CP1. When there is no restriction by a local magnetic field, CP1<CP2 is satisfied considering a potential. At this time, a current flows in CP1. By generating a voltage again, a current flows in CP1.

In this way, in the superconducting wire including IBC, when a current of 100 A flows in the entire wire material, the current flows in CP1 and CP2 which are local paths, and therefore a voltage is generated all the time. Even when a constant current which we believe a steady state flows, an electromotive force is generated locally. The electromotive force has a significantly large value of 15 µV under conditions of 50 K and 5 T at a width of 1 cm, and it is considered that the electromotive force causes quenching.

A reason why the local voltage caused by IBC does not appear as a whole is described below. It is considered that even when an electromotive force of 15 µV is generated by a voltage at a width of 1 cm, a current thereby flows to become a Joule heat, and the Joule heat disappears therearound. Even when the electromotive force remains, the length of 500 m is as long as 50000 times of 1 cm. Therefore, the generated electromotive force is averaged no matter whether the value of the electromotive force is positive or negative. Therefore, it is necessary to evaluate II by an electromotive force between terminals having a distance of 1 cm from each other.

In the above description, CP1 and CP2 perform simple oscillation. However, a current path of CP3 which is metastable and can maintain the state may be present. As a potential, CP1 has been defined as a minimum, and therefore this is a rare case where CP1<CP3 is maintained. By assuming that this rare case occurs at a possibility of 99%, a possibility of stability (PS) indicating whether a superconducting wire having a length of 500 m can be applied stably as a coil can be calculated easily. That is, $PS=0.99^{\wedge}(500/0.01)=10^{\wedge}(-218)$ is satisfied.

Even a length of 1 cm is an unstable area. Even when a metastable state is obtained at a high possibility of 99% which is unlikely, a possibility that the state is successful continuously in 50000 portions as a line of 500 m is astronomically low as described above. That is, it is considered that it is almost impossible in principle to manufacture a long wire material with a wire material having Tc lowered and to use the wire material stably as a coil.

The above argument suggests that it is very difficult to manufacture a wire material applied to a coil with an artificial pin to lower Tc, such as a BZO artificial pin. The BZO artificial pin lowers Tc because of having a Perovskite structure like YBCO and having a correlation with YBCO at the time of growth of a crystal.

Examples of an artificial pin having no correlation with growth of a Perovskite structure include $Dy_2O_3$. $Dy_2O_3$ has no correlation with the growth, and therefore particles thereof are easily grown during a heat treatment to obtain a size much larger than 3 nm. For example, when the size becomes 30 nm, the volume becomes 1000 times and the number of artificial pins becomes 1/1000 of the estimated number, exhibiting a smaller effect. In addition, by the large size, many quantum magnetic fluxes enter an artificial pin, and a Lorentz force corresponding to the number of the quantum magnetic fluxes is applied. The Lorentz force thereby becomes larger than a pin force, and a magnetic field characteristic is not improved.

In addition to the above method, it has been tried to form a pin force by radiation irradiation. This technology is as follows. That is, energy is added to a portion irradiated with radiation to make a sample non-superconductive or to form a void, or the size of an artificial pin can be adjusted by irradiation energy.

When the portion of an artificial pin formed by radiation irradiation becomes a void or a state thereof is changed, an influence thereof on an adjacent superconducting unit cell is not zero. By change in an oxygen distribution, a superconducting characteristic such as Tc is changed, and an irradiation portion and a surrounding portion thereof are influenced thereby. It has been reported that Tc is largely lowered in an entire wire material actually. Even in the method for forming an artificial pin by radiation irradiation, the IBC problem cannot be avoided.

In order to solve the IBC problem radically, it is considered that a ultimate design to make only a portion of a Perovskite structure superconductive while the Perovskite structure is maintained is necessary. In this artificial pin, the portion in which the Perovskite structure is maintained functions as a superconductor, and Tc is not lowered as long as a lattice size is maintained and the number of oxygen atoms is also maintained. This technology for introducing an artificial pin while a Perovskite structure is maintained is an atom-replaced artificial pin (ARP: Atom-Replaced Pin).

A unit cell which becomes non-superconductive while a Perovskite structure is maintained is necessary for ARP, and this element is only Pr in view of studies so far. Pr in PrBCO is trivalent when a Perovskite structure is formed. Pr can form a Perovskite structure because of being trivalent, but it is considered that tetravalent Pr forms $PrO_2$. Ce does not form a Perovskite structure because of being tetravalent. When Pr becomes tetravalent, $PrO_2$ is formed, and Pr cannot form a Perovskite structure.

It is considered that trivalent Pr forms a Perovskite structure, and becomes tetravalent subsequently, and a unit cell thereof thereby becomes non-superconductive. It is considered that a 1/3 Perovskite unit cell which has received Pr at that time is contracted by about 14%, and becomes non-superconductive. It is considered that the deformation is transferred to a first adjacent unit cell in an a/b plane and the four unit cells also become non-superconductive. In this way, when Pr is ultimately dispersed, a "5 times degradation phenomenon" in which Jc degradation of five times the Pr content is observed is confirmed.

By mixing YBCO and PrBCO, ultimately-dispersed PrBCO is formed. Even when a pin size obtained by the 5 times degradation phenomenon is considered, the size is only 1.2 nm in an a/b axis direction. From a result of Jc-B measurement, it has been found that there is not a large effect on a particularly high magnetic field side. When a magnetic field characteristic is tried to be improved by causing an effect of an artificial pin to be exhibited at 30 K or 40 K, it is necessary to increase the size of the artificial pin. That is, it is necessary to assemble dispersed PrBCO.

In film formation of a superconductor having a Perovskite structure by the TFA-MOD method, shape anisotropy of a unit cell seems to be applied strongly. It is considered that PrBCO forming a Perovskite structure is formed of a unit cell larger than YBCO at the time of formation of the Perovskite structure, and PrBCO is ultimately dispersed. It is considered that this is a phenomenon caused by a fact that a possibility of forming PrBCO in an adjacent site is largely reduced because a PrBCO unit cell has a larger shape than YBCO when being formed from a pseudo-liquid phase.

However, it is known that this shape anisotropy forms a cluster when an element having a large or small ion size is present in a portion other than a matrix phase. By mixing SmBCO formed of a large unit cell and LuBCO formed of a small unit cell in a matrix phase of YBCO, SmBCO and LuBCO are assembled due to shape anisotropy to form a cluster.

Similarly, it has been tried to form a cluster of PrBCO and LuBCO on the basis of shape anisotropy. However, it has been found that clustering does not occur and a magnetic field characteristic is not improved on a particularly high magnetic field side. In addition, it has been tried to form a cluster of PrBCO and TmBCO considering a difference in a size between PrBCO and LuBCO. However, clustering has not occurred.

In order to cause an atom-replaced artificial pin to function by the TFA-MOD method, a technology to form a cluster of PrBCO somehow and to improve a magnetic field characteristic has been required.

It is difficult to form a structure in which a unit cell of PrBCO is dispersed in a superconductor of REBCO by a physical deposition method. In the physical deposition method, stoichiometry cannot be controlled strictly, and a composition deviation of several % is generated everywhere. It is almost impossible to form only a part of a Perovskite structure of PrBCO and to form other adjacent unit cells of YBCO. Therefore, even when PrBCO can be formed, a Perovskite structure different from Y in a matrix phase is obtained, and a possibility of uneven distribution is high. In addition, an oxygen partial pressure ($p(O_2)$) for forming a Perovskite structure in YBCO is 1000 ppm. An oxygen partial pressure ($p(O_2)$) in PrBCO is considered to be 1 ppm when being estimated from an optimal value of 20 ppm in SmBCO and an optimal value of 5 ppm in NdBCO. Also in view of this difference in $p(O_2)$, YBCO and PrBCO cannot be formed simultaneously. When a film is formed under a condition for one of YBCO and PrBCO, the other is decomposed, and does not form a Perovskite structure.

When a film of PrBCO is formed while being present together with YBCO by a sputtering method which is a physical deposition method like a PLD method, Tc is lowered by 4 K by adding 10% PrBCO. In addition, it is considered that PrBCO is unevenly distributed in a form not forming a Perovskite structure. Also from this fact, it is considered that it is difficult to form YBCO and PrBCO in the same crystal by a physical deposition method.

It is estimated that a physical deposition method other than a sputtering method brings about almost the same result. It is considered that a film is formed by flying of an individual element to a substrate in the sputtering method and a PLD method, and it is thereby necessary to control an oxygen partial pressure strictly. It is almost impossible to simultaneously form films of substances in which one substance has an optimal oxygen partial pressure of 1000 times that of the other substance. It is considered that a MOCVD is almost similar. In this method, an organic substance is decomposed after a metal element reaches a substrate. At the time of film formation, necessary oxygen partial pressures of YBCO and PrBCO are considered to be 1000 ppm and 1 ppm at 800° C., respectively. It can be imagined easily that film formation by coexistence is difficult.

A trial to improve a magnetic field characteristic by forming YBCO+PrBCO in a bulk body has been reported, and a result of largely lowered Tc has been reported. It is considered that this is caused by a fact that a lattice constant of a PrBCO assembly is reduced by 12 to 14% when each of PrBCO and YBCO is formed as an assembly and the valence of Pr is changed from three to about four by a succeeding valance change of Pr, physical separation from a YBCO assembly is caused, and an adhering condition is deteriorated. In size change of PrBCO, Tc is lowered also by generating a gap between particles of about 1 μm in YBCO. In other words, the report using a bulk body indicates that unit cells of YBCO and PrBCO indicated in the present embodiment cannot form the same Perovskite structure.

A superconductor lowers Tc, but it is estimated that such a magnetic field as designed is not formed due to generation of an inner bypass current and a wire material for a coil to be quenched easily is obtained.

In the TFA-MOD method, a plurality of REBCO having largely different film-forming conditions can be formed into a single Perovskite structure. This is because by forming high purity solutions and then mixing the solutions at an arbitrary ratio, a superconductor having a single Perovskite structure can be formed while a plurality of elements are present in a Y site having the same lattice constant.

However, this is a case of elements having a small difference in an atomic radius, such as Tm and Dy. In this case, Tc is a value in the middle of those of two superconductors mixed, and a single peak having an intermediate lattice length is observed also from a result of XRD measurement. This result is that substances having different atomic radii form the same Perovskite structure, a lattice constant is an intermediate value, and a Tc value is also an intermediate value.

In the present embodiment, formation is performed while elements having a large difference in an atomic radius, such as Pr and Y are present together, but it is essential to purify a solution highly for achievement thereof. Presence of an impurity in a solution forms a decomposition phase starting from the impurity, or causes Pr having a largely different film formation condition from Y to be distributed unevenly in a case where Y is a matrix phase. For prevention thereof, it is effective to purify a solution highly and to prevent formation of a different phase without forming a decomposition phase even under conditions of 800° C. and 1000 ppm under which PrBCO is hardly formed.

Even when an element is unstable like Pr, by mixing the element with a stable element such as Y to synthesize a solution, a stable solution as a whole can be obtained. This is a partially stabilized solvent-into gel method, and is referred to as a PS-SIG method. In the PS-SIG method, the Pr content which can be mixed is estimated to be 20%, and this determines an upper limit molar content of PA+SA. The limit of the CA content is the same, and therefore the CA content has an upper limit value of 20%. That is, PA+SA+CA+MA=100% is satisfied, and therefore the MA content has a lower limit value of 60%.

By performing usual calcining, firing, and oxygen annealing on the basis of the coating solution prepared in this way, an artificial pin having a magnetic field characteristic improved is obtained. In addition, a superconductor including an artificial pin containing no IBC is obtained.

Figure 8:
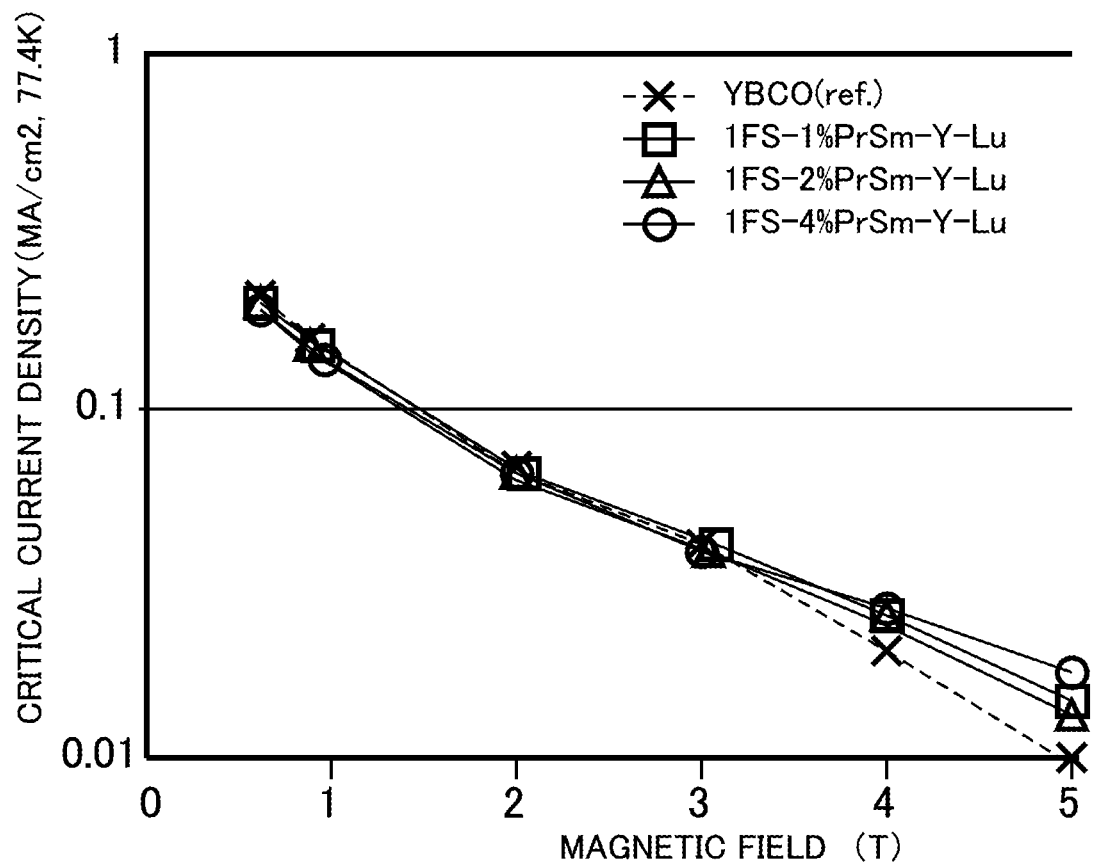
FIG. 8 is a diagram illustrating functions and effects of the first embodiment.

FIG. 8 is a diagram illustrating functions and effects of the present embodiment. FIG. 8 is a diagram illustrating a relation between a magnetic field of the oxide superconductor in the present embodiment and a critical current density thereof. FIG. 8 illustrates a measurement result of a sample of YBCO containing no rare earth element other than yttrium (in FIG. 8, crossed mark) in Comparative Example, and a measurement result of a sample in which the contents of praseodymium, samarium, yttrium, and lutetium in the rare earth element are 1%, 1%, 96%, and 2%, respectively (in FIG. 8, square mark), a sample in which the contents of praseodymium, samarium, yttrium, and lutetium in the rare earth element are 2%, 2%, 92%, and 4%, respectively (in FIG. 8, triangle mark), and a sample in which the contents of praseodymium, samarium, yttrium, and lutetium in the rare earth element are 4%, 4%, 84%, and 8%, respectively (in FIG. 8, circle mark) in the present embodiment. The horizontal axis indicates a magnetic field (T), and the vertical axis indicates a Jc value ($MA/cm^2$).

As clear from FIG. 8, in the present embodiment, a critical current density higher than that in Comparative Example is obtained particularly in a region higher than 3 T.

Figure 9:
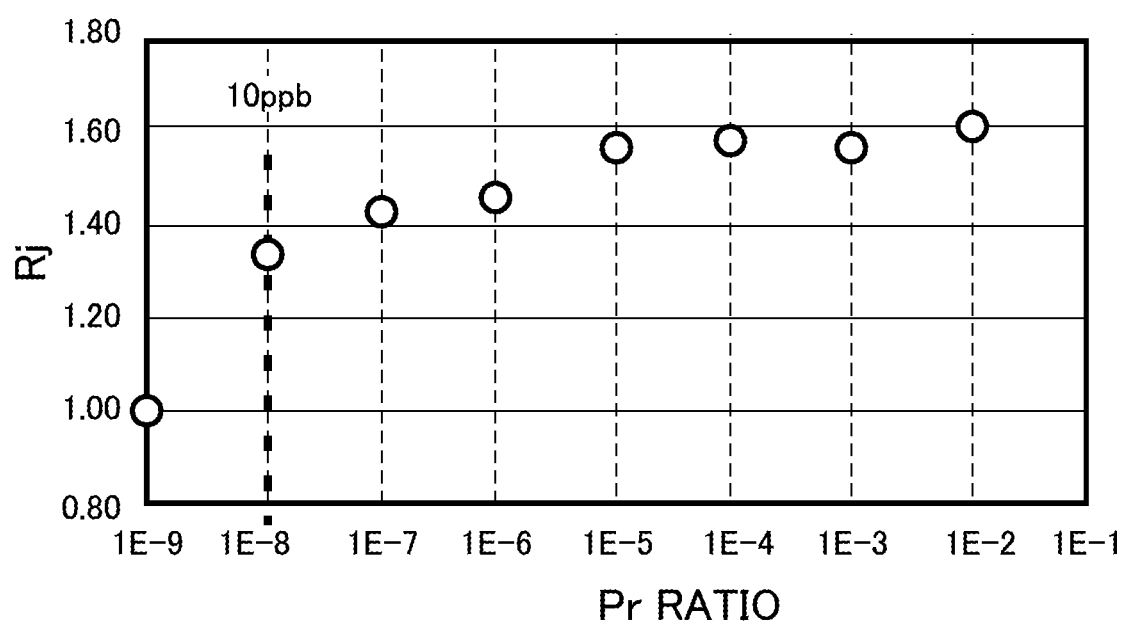
FIG. 9 is a diagram illustrating functions and effects of the first embodiment.

FIG. 9 is a diagram illustrating functions and effects of the present embodiment. FIG. 9 is a diagram illustrating a relation between a ratio (Pr ratio) of praseodymium in the rare earth element and an effect of improvement of a magnetic field characteristic.

Rj indicating the effect of improvement of a magnetic field characteristic is defined as follows. A Jc value of YBCO at 77 K at 5 T is assumed to be 1, and a characteristic of a sample in the present embodiment at 77 K at 5 T is represented by a ratio. For example, when a Jc value is 1.61 times in a case of a Pr ratio of 1%, Rj=1.61 is obtained.

FIG. 9 indicates that the effect of improvement of a magnetic field characteristic is obtained when a ratio of praseodymium is 10 ppb (=0.00000001) or more. Therefore, the Pr ratio is desirably 10 ppb or more.

When the number of atoms of rare earth elements is N(RE), and the number of atoms of the first element as PA, that is, praseodymium is N(PA), a Pr ratio can be represented by N(PA)/N(RE). Therefore, 0.00000001≤N(PA)/N(RE) is desirably satisfied.

Figure 10A:
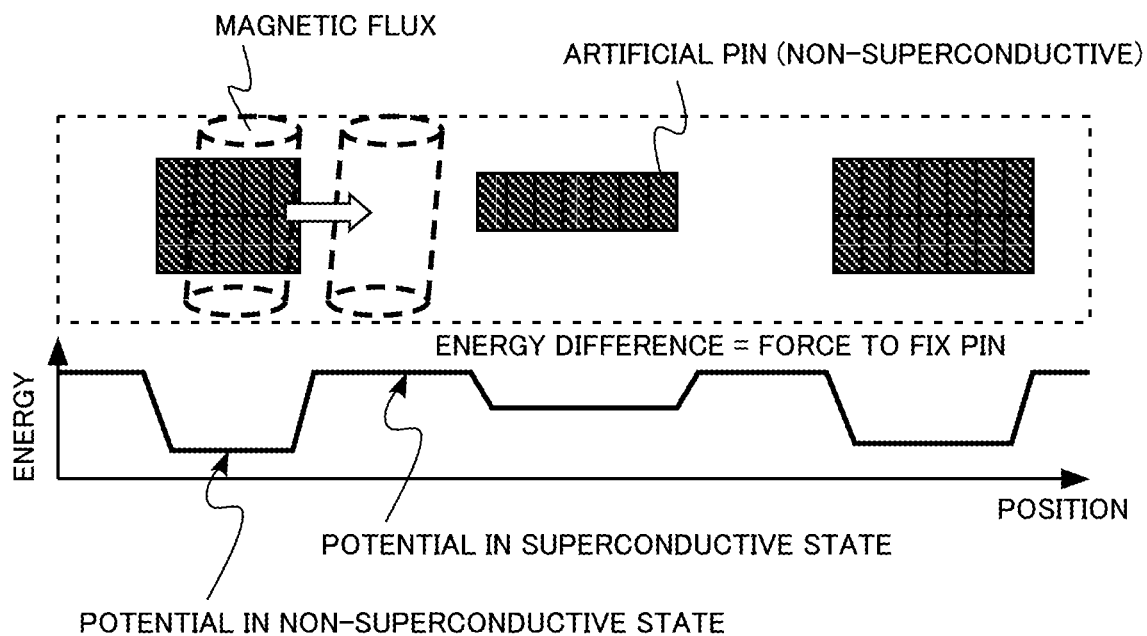
FIGS. 10A and 10B are diagrams illustrating functions and effects of the first embodiment.
Figure 10B:
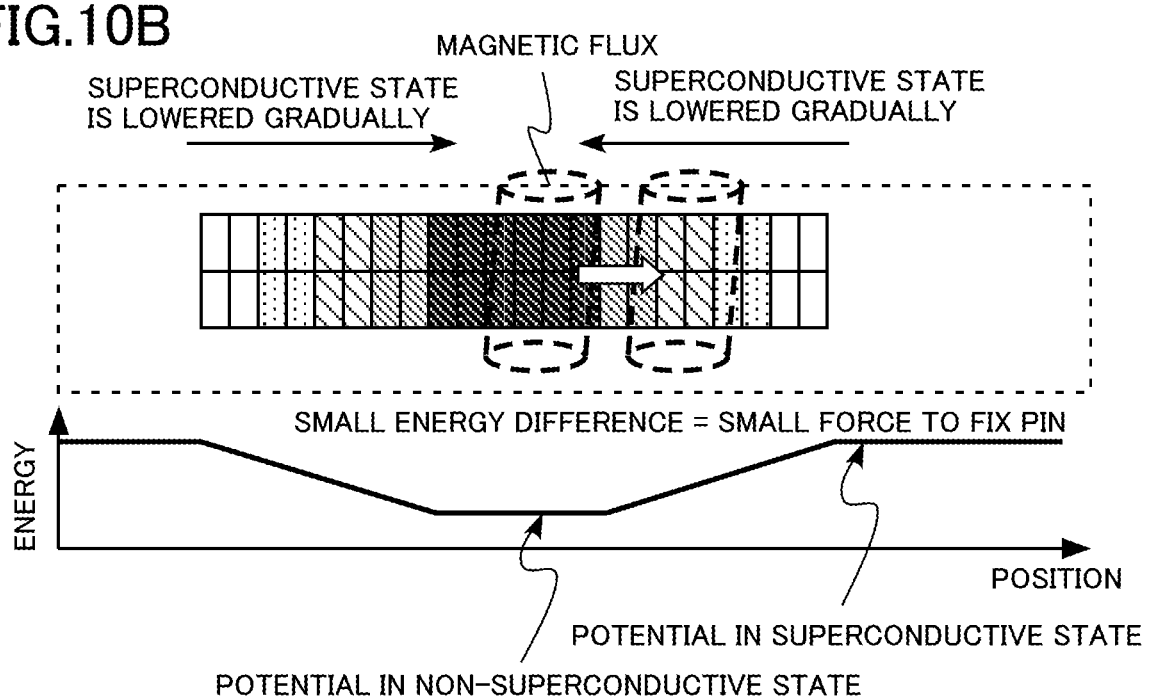

FIGS. 10A and 10B are diagrams illustrating functions and effects of the present embodiment. FIG. 10A is an explanatory diagram of the oxide superconductor of the present embodiment. FIG. 10B is an explanatory diagram of an oxide superconductor including a BZO artificial pin in a comparative embodiment.

In the BZO artificial pin, YBCO and BZO are present at a lattice size of about 9%. Therefore, a discontinuous surface is formed, and Tc is lowered in the portion. A potential as a superconducting state is lowered. In addition, it has been reported that the BZO artificial pin extracts an oxygen atom from a YBCO unit cell to lower Tc. In this case, a superconducting characteristic of YBCO is lowered. That is, in a structure in which the BZO artificial pin is introduced in a YBCO superconductor formed by a physical deposition method, a pin force is reduced inevitably.

On the other hand, an atom-replaced artificial pin has a high pin force. The atom-replaced artificial pin has a Perovskite structure continuous with a matrix phase. In a process in which a part of PrBCO in a matrix phase is cooled to a normal temperature, Pr becomes tetravalent to obtain a non-superconductive artificial pin. It is considered that a first adjacent cell thereof becomes non-superconductive by a 5 times degradation phenomenon but a second adjacent cell thereof is a superconductor having Tc slightly lowered. Therefore, a difference in a potential between a 5 times degradation portion and a superconducting portion is large, and a pin force becomes large.

A clustered artificial pin has cluster non-superconductivity of about 75%. A pin force thereof is incomparably larger than that of the BZO artificial pin, and therefore it is considered that an effect is exhibited by a small amount of Pr (10 ppb). In the conventional BZO artificial pin, a potential is lowered at random in a portion around the artificial pin, and it is considered that countless paths for releasing a quantum magnetic flux are formed. It is considered that a pin force is thereby lowered.

On the other hand, in the present embodiment, a boundary between an artificial pin and a superconductor is clear. Therefore, it is considered that a magnetic flux can be captured even by a small amount of the artificial pin to exhibit an effect of improvement of a magnetic field characteristic. However, it is considered that it is necessary to form a cluster into a smaller size in order to exhibit an effect at a temperature lower than 77 K.

There is no example of a report that an effect as an artificial pin can be exhibited by such a small amount thereof in the past. It can be understood that the atom-replaced artificial pin is completely different from another artificial pin. In addition, it has been found for the first time that the atom-replaced artificial pin exhibits an effect even in an incredibly small amount thereof. It is considered that a BZO artificial pin functions in a useless manner to reduce an effect rather than that the atom-replaced artificial pin exhibits an effect even in a small amount thereof.

Figure 11:
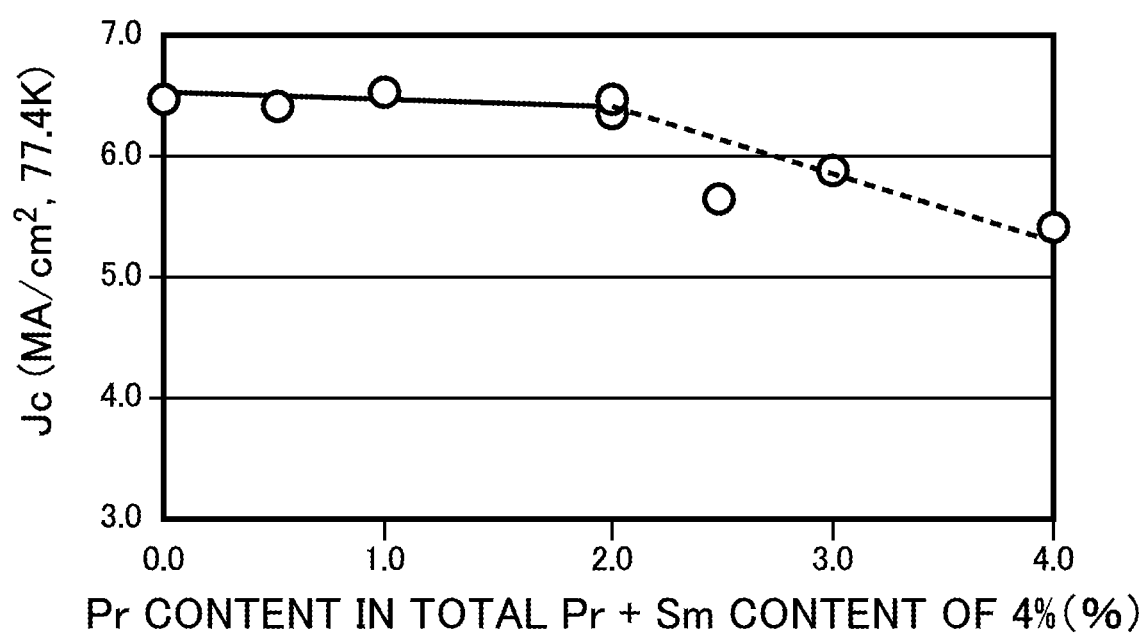
FIG. 11 is a diagram illustrating functions and effects of the first embodiment.

FIG. 11 is a diagram illustrating functions and effects of the present embodiment. FIG. 11 is a diagram illustrating a relation between a content ratio between PA and SA forming a large unit cell and a superconducting characteristic.

Measurement is performed for a sample in which PA is praseodymium (Pr), SA is samarium (Sm), MA is yttrium (Y), and CA is lutetium (Lu). The X-axis indicates the Pr content (%), and the Y-axis indicates a Jc value of a superconductor. The content of Pr+Sm is 4% all the time. The content of Lu is 8% all the time.

FIG. 11 indicates that when the ratio of praseodymium becomes more than 50% with respect to the sum of praseodymium and samarium, a Jc value is lowered. When the ratio of praseodymium is less than 5%, there is a risk that an effect of improvement of a magnetic field characteristic could not be obtained.

Therefore, when the number of atoms of the first element as PA is N(PA), and the number of atoms of the second element as SA is N(SA), $0.05 \leq N(PA)/(N(PA)+N(SA)) \leq 0.5$ is desirably satisfied.

When the number of atoms of rare earth elements is N(RE), and the number of atoms of the third element as MA is N(MA), $N(MA)/N(RE) \geq 0.6$ is desirably satisfied. When the ratio is less than the above range, a ratio of a superconducting unit cell is reduced, and there is a risk that a sufficient superconducting characteristic could not be obtained.

When the number of atoms of the third element as MA is N(MA), and the number of atoms of yttrium contained in the third element is N(Y), $N(Y)/N(MA) \geq 0.5$ is desirably satisfied. A material of yttrium (Y) is relatively inexpensive, and therefore cost of the oxide superconductor 100 can be reduced.

When the number of atoms of rare earth elements is N(RE), the number of atoms of the first element as PA is N(PA), and the number of atoms of the second element as SA is N(SA), $(N(PA)+N(SA))/N(RE) \leq 0.2$ is desirably satisfied. When the ratio is more than the above range, a ratio of a superconducting unit cell is reduced, and there is a risk that a sufficient superconducting characteristic could not be obtained.

When the number of atoms of the first element as PA is N(PA), the number of atoms of the second element as SA is N(SA), and the number of atoms of the fourth element as CA is N(CA), $0.8 \times N(CA) \leq N(PA)+N(SA) \leq 1.2 \times N(CA)$ is desirably satisfied. When the above condition is not satisfied, the number of PA, SA, or CA not forming a cluster is increased, and a superconducting characteristic may be reduced.

The oxide superconductor layer 30 desirably contains fluorine of $2.0 \times 10^{15}$ atoms/cc or more and $5.0 \times 10^{19}$ atoms/cc or less and carbon of $1.0 \times 10^{17}$ atoms/cc or more and $5.0 \times 10^{20}$ atoms/cc or less.

For example, it is considered that residual fluorine and residual carbon maintain a magnetic field characteristic in such a very high magnetic field to exceed 15 T.

The fluorine contained in the oxide superconductor layer 30 more desirably has a concentration of $2.0 \times 10^{16}$ atoms/cc or more from the above viewpoint. For example, the carbon contained in the oxide superconductor layer 30 more desirably has a concentration of $1.0 \times 10^{18}$ atoms/cc or more.

As described above, according to the present embodiment, an oxide superconductor into which an artificial pin capable of suppressing IBC and having a strong pin force is introduced and which has a magnetic field characteristic improved, and a method for manufacturing the same are realized.

Second Embodiment

An oxide superconductor of the present embodiment includes an oxide superconductor layer having a continuous Perovskite structure containing rare earth elements, barium (Ba), and copper (Cu). The rare earth elements contains a first element which is praseodymium (Pr), at least one second element selected from the group consisting of gadolinium (Gd), yttrium (Y), terbium (Tb), dysprosium (Dy), and holmium (Ho), and at least one third element selected from the group consisting of erbium (Er), thulium (Tm), ytterbium (Yb), and lutetium (Lu).

The oxide superconductor of the present embodiment is different from the first embodiment in that an oxide superconductor layer 30 contains no supporting atom (SA) in the first embodiment. Hereinafter, description of matters overlapping with the first embodiment is omitted.

The oxide superconductor layer 30 in the present embodiment contains a third generation type clustered atom-replaced artificial pin (third CARP: 3rd-Clustered Atom Replaced Pin).

The oxide superconductor layer 30 in the present embodiment is formed of PA, MA, and CA. The first element is a pinning atom (PA), the second element is a matrix atom (MA), and the third element is a counter atom (CA).

By adjusting an average size of MA and making an average ionic radius of each of PA and CA closer to that of MA directly, a cluster is formed to act as an artificial pin.

In the oxide superconductor layer 30 in the present embodiment, SA as a superconducting unit cell is not present, and therefore a potential in an artificial pin site is equal to a complete non-superconductor. Therefore, a pin force becomes a theoretically maximum value.

When the number of atoms of rare earth elements is N(RE), and the number of atoms of the second element as MA is N(MA), $N(MA)/N(RE) \geq 0.6$ is desirably satisfied. When the ratio is less than the above range, a ratio of a superconducting unit cell is reduced, and there is a risk that a sufficient superconducting characteristic could not be obtained.

When the number of atoms of the second element is N(MA), and the number of atoms of yttrium contained in the second element as MA is N(Y), N(Y)/N(MA)≥0.5 is desirably satisfied. A material of yttrium (Y) is relatively inexpensive, and therefore cost of an oxide superconductor can be reduced.

When the number of atoms of rare earth elements is N(RE), and the number of atoms of the first element as PA is N(PA), 0.00000001≤N(PA)/N(RE) is desirably satisfied. When the ratio is less than the above range, there is a risk that a sufficient effect of improvement of a magnetic field characteristic could not be obtained.

When the number of atoms of rare earth elements is N(RE), and the number of atoms of the first element as PA is N(PA), N(PA)/N(RE)≤0.2 is desirably satisfied. When the ratio is more than the above range, a ratio of a superconducting unit cell is reduced, and there is a risk that a sufficient superconducting characteristic could not be obtained.

As described above, according to the present embodiment, similarly to the first embodiment, an oxide superconductor into which an artificial pin capable of suppressing IBC and having a strong pin force is introduced and which has a magnetic field characteristic improved, and a method for manufacturing the same are realized. Furthermore, the present embodiment has a better magnetic field characteristic than the first embodiment.

Hereinafter, Examples are described.

EXAMPLES

In Examples, a solution or a superconductor having a Perovskite structure is formed by mixing many metal acetates. In a Y-based superconductor having a Perovskite structure, Y or an element in a lanthanoid group is present in a Y site (rare earth site), and Ba and Cu are present in the other sites. A ratio thereamong is 1:2:3. Therefore, by paying attention to a metal element used in the Y site, description is made as follows.

In the present Example, four kinds of elements (three kinds of elements in a part) are necessary as an element in the Y site. PA for generating an artificial pin and SA for assisting PA. MA for acting as a matrix phase. Finally, CA necessary for forming a cluster, having a small ionic radius. Only Pr can be used for PA. Nd, Sm, Eu, and Gd can be used for SA. Tb, Dy, Ho, and Y can be used for MA. Er, Tm, Yb, and Lu can be used for CA. As the third CARP, Gd can be used also as a part of MA.

In an Example in which most parts are clustered, PA=SA and PA+SA=CA are satisfied in terms of the number of moles (the number of atoms). The number obtained by subtracting PA+SA+CA from the total number is equal to MA. PA+SA+MA+CA=100% is satisfied. For example, it is assumed that there is a mixing ratio of 4% Pr(PA), 4% Sm(SA), 84% Y(MA), and 8% Lu(CA). Here, this is described as 4% Pr4% Sm—Y-8% Lu. However, when the number of large elements is the same as the number of small elements in a cluster portion, that is, when PA+SA=CA is satisfied, the content of CA is omitted, and this case is described as 4% Pr4% Sm—Y—Lu. In addition, when PA=SA is satisfied and the kind of SA is one, the content thereof is also omitted. That is, the above case is described as 4% PrSm—Y—Lu. This description indicates 4% Pr4% Sm-84% Y-8% Lu.

An element is described in the order of a lanthanoid group element having a smaller atomic number, and is described in the order of PA, SA, MA, and CA. When Y is used for MA, Y is described in the end. PA+SA, MA, and CA are joined with a bar. That is, this is described as 4% Pr4% Sm—Y—Lu. There is also a case where no SA is contained. However, even when PA+SA=CA is satisfied in this case, the content of CA can be omitted. For example, a case of 4% Pr—Y-4% Lu is described as 4% Pr—Y—Lu.

Example 1

First, four kinds of coating solutions for a superconductor were synthesized and purified according to the flowchart illustrated in FIG. 4. Powdery hydrates of $Pr(OCOCH_3)_3$, $Y(OCOCH_3)_3$, $Lu(OCOCH_3)_3$, $Ba(OCOCH_3)_2$, and $Cu(OCOCH_3)_2$ as metal acetates were dissolved in ion exchange water at a metal ion molar ratio of 0.04:0.92:0.04:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 1Mi-4% Pr—Y—Lu (substance described in Example 1, Y-based material with impurity) was obtained.

Similarly, powdery hydrates of $Pr(OCOCH_3)_3$, $Y(OCOCH_3)_3$, $Tm(OCOCH_3)_3$, $Ba(OCOCH_3)_2$, and $Cu(OCOCH_3)_2$ as metal acetates were dissolved in ion exchange water at a metal ion molar ratio of 0.04:0.92:0.04:2:3, powdery hydrates of $Pr(OCOCH_3)_3$, $Sm(OCOCH_3)_3$, $Y(OCOCH_3)_3$, $Tm(OCOCH_3)_3$, $Ba(OCOCH_3)_2$, and $Cu(OCOCH_3)_2$ as metal acetates were dissolved in ion exchange water at a metal ion molar ratio of 0.04:0.04:0.84:0.08:2:3, and powdery hydrates of $Pr(OCOCH_3)_3$, $Sm(OCOCH_3)$, $Y(OCOCH)_3$, $Tm(OCOCH_3)_3$, $Ba(OCOCH_3)_2$, and $Cu(OCOCH_3)_2$ as metal acetates were dissolved in ion exchange water at a metal ion molar ratio of 0.02:0.02:0.92:0.04:2:3. Each of the resulting solutions was mixed with $CF_3COOH$ in an equal reaction molar amount, and was stirred. The resulting mixed solution was put in an eggplant-shaped flask, and was subjected to a reaction and purification in a rotary evaporator under reduced pressure for 12 hours. Semitransparent blue substances 1Mi-4% Pr—Y—Tm, 1Mi-4% PrSm—Y—Lu, and 1Mi-2% PrSm—Y—Lu were obtained.

Each of the obtained semitransparent blue substances 1Mi-4% PrYLu, 1Mi-4% PrYTm, 1Mi-4% PrSm—Y—Lu, and 1Mi-2% PrSm—Y—Lu contained water or acetic acid as a byproduct of a reaction at the time of synthesis of a solution in an amount of about 7 wt %.

The obtained semitransparent blue substances 1Mi-4% Pr—Y—Lu, 1Mi-4% Pr—Y—Tm, 1Mi-4% PrSm—Y—Lu, and 1Mi-2% PrSm—Y—Lu were each completely dissolved in methanol having a weight about 100 times each of the substances (f in FIG. 4), and the solutions were subjected to a reaction and purification again in a rotary evaporator under reduced pressure for 12 hours to obtain semitransparent blue substances 1M-4% Pr—Y—Lu (substance described in Example 1, Y-based material without impurity), 1M-4% Pr—Y—Tm, 1M-4% PrSm—Y—Lu, and 1M-2% PrSm—Y—Lu, respectively.

The semitransparent blue substances 1M-4% Pr—Y—Lu, 1M-4% Pr—Y—Tm, 1M-4% PrSm—Y—Lu, and 1M-2% PrSm—Y—Lu were each dissolved in methanol (j in FIG. 4), and were diluted using a measuring flask to obtain 1.50 mol/l (in terms of a metal ion) coating solutions 1Cs-4% Pr—Y—Lu (Example 1, coating solution for Y-based superconductor), 1Cs-4% Pr—Y—Tm, 1Cs-4% PrSm—Y—Lu, and 1Cs-2% PrSm—Y—Lu, respectively.

A film was formed by using the coating solutions 1Cs-4% Pr—Y—Lu, 1Cs-4% Pr—Y—Tm, 1Cs-4% PrSm—Y—Lu, and 1Cs-2% PrSm—Y—Lu by a spin coating method at a maximum rotation number of 2000 rpm, calcining was performed in an atmosphere of pure oxygen at 400° C. or lower according to the profile illustrated in FIG. 6, firing was performed in a 1000 ppm oxygen-mixed argon gas at 800° C. according to the profile illustrated in FIG. 7, and annealing was performed in pure oxygen at 525° C. or lower to obtain superconducting films 1FS-4% Pr—Y—Lu (Example 1, Y-based film of superconductor), 1FS-4% Pr—Y—Tm, 1FS-4% PrSm—Y—Lu, and 1FS-2% PrSm—Y—Lu, respectively.

Measurement was performed for the superconducting films 1FS-4% Pr—Y—Lu, 1FS-4% Pr—Y—Tm, 1FS-4% PrSm—Y—Lu, and 1FS-2% PrSm—Y—Lu by a $2\theta/\omega$ method in XRD measurement, and it was confirmed that a peak was obtained at almost the same position as a YBCO (00n) peak. This result indicates that PrBCO, SmBCO, TmBCO, and LuBCO have been formed in the same Perovskite structure as YBCO.

The superconducting films 1FS-4% Pr—Y—Lu, 1FS-4% Pr—Y—Tm, 1FS-4% PrSm—Y—Lu, and 1FS-2% PrSm—Y—Lu were each disposed in liquid nitrogen, and a superconducting characteristic thereof was measured under a self-magnetic field by an induction method. Jc values thereof were 5.2, 5.1, 6.3, and 6.4 MA/cm$^2$ (77 K, 0 T), respectively. In the superconducting films 1FS-4% Pr—Y—Lu and 1FS-4% Pr—Y—Tm, a 5 times degradation phenomenon caused by ultimate dispersion of PrBCO has been confirmed. However, in the superconducting films 1FS-4% PrSm—Y—Lu and 1FS-2% PrSm—Y—Lu, a satisfactory superconducting characteristic has been confirmed. When a film is formed on a LaAlO$_3$ single crystal substrate so as to have a thickness of 220 nm, there is an influence of an a/b-axis oriented particle, and a maximum characteristic is in a lower 6 MA/cm$^2$ range.

FIG. 2 illustrates a result obtained by observing a cross-section of the superconducting film 1FS-4% PrSm—Y—Lu with high resolution TEM at a magnification of 4000000. For example, in a portion on an upper left side of the two portions surrounded by the white broken line frames, among atoms arranged in three rows in a horizontal direction, atoms in two rows upper and lower are in a barium (Ba) site. It is considered that this TEM observation image has a sample thickness of about 30 nm. In FIG. 2, an upward direction is a c-axis, and a depth direction is an a/b-axis. A unit cell has a width of about 0.4 nm. In the depth direction, about 75 unit cells are arranged.

A Ba site in which the 75 unit cells are arranged almost linearly emits light brightly. It is considered that fluctuation occurs also in the Ba site. An image becomes unclear by having an influence of the fluctuation. That is, the Ba site becomes dark. In a portion in which an image in the Ba site is clear, any one of Y, Pr, Sm, and Lu is present in a rare earth site in the central portion. This HAADF-STEM image is obtained by an analysis method to cause a substance having a larger atomic weight to emit light brightly. It is known that Pr, Sm, or Lu emits light about three times brightly with respect to Y. Therefore, by performing standardization with brightness of the Ba site and comparison in brightness between rare earth sites in the central portions, it is found whether many Y atoms are present or many Pr, Sm, and Lu atoms are present.

The following is rough approximation. However, in FIG. 2, total brightness in the two portions of the rare earth sites (one row, ten points) indicated by the white solid line frames is calculated, and total brightness in the Ba site (two rows, twenty points) is calculated. When a numerical value obtained by dividing the total brightness in the rare earth sites by the total brightness in the Ba site is represented by R(RE/Ba), R(RE/Ba) of the white solid line frames is 1.3 times or more that of the white broken line frame. In this TEM image, about 75 unit cells are present in the depth direction. Therefore, when Pr, Sm, and Lu emitting light brightly are disposed at random in the rare earth sites, a possibility that a difference of 1.3 times is made is almost 0% due to averaged brightness. This fact that a difference of 1.3 times or more is made in R(RE/Ba) is an evidence of clustering. It is considered that this indicates that Pr is present together with a Sm—Lu cluster.

In this way, four kinds of unit cells having largely different lattice sizes can be formed into the same Perovskite structure simultaneously due to an effect of solution purification by a PS-SIG method. However, this structure is unique to the TFA-MOD method for forming a unit cell from a pseudo-liquid phase and forming a cluster due to shape anisotropy.

When films of PrBCO, SmBCO, YBCO, and LuBCO are formed by a physical deposition method, oxygen partial pressures considered to be optimal at a film formation temperature of 800° C. are 1, 20, 1000, and 2500 ppm, respectively. It is known that an optimal oxygen partial pressure has a relation to monotonous reduction of a rare earth ionic radius while a Perovskite structure is formed. Therefore, when this structure is tried to be formed by a physical deposition method such as a PLD method or a MOCVD method, the structure in FIG. 2 is not realized because separated unit cells are formed due to largely different optimal oxygen partial pressures.

In addition, oxygen partial pressures in PrBCO and SmBCO are too largely different from each other. Therefore, when a film is formed at 1000 ppm for YBCO, another decomposed product is obtained. Examples thereof include Sm$_2$O$_3$. A fact that unit cells containing four kinds of rare earth elements having largely different ionic radii can be incorporated into the same Perovskite structure is an important result of combination of the TFA-MOD method and the PS-SIG method.

A Jc value of each of the superconducting films 1FS-4% Pr—Y—Lu, 1FS-4% Pr—Y—Tm, 1FS-4% PrSm—Y—Lu, and 1FS-2% PrSm—Y—Lu in a magnetic field of 1 to 5 T at 77 K was measured.

The superconducting film 1FS-4% Pr—Y—Lu did not improve a characteristic in a high magnetic field from a low superconducting characteristic which is considered to be 5 times degradation of Pr, and lowered the characteristic to about a half of that of a YBCO film at 5 T. It is considered that this is because Pr did not function as an artificial pin due to ultimate dispersion, Pr did not capture a quantum magnetic flux in a high magnetic field, an influence of IBC was also added, and the characteristic was lowered.

The superconducting film 1FS-4% Pr—Y—Tm exhibited 5 times or more degradation. Details thereof are not clear, but it may be sure that at least a clustered artificial pin has not been formed under this condition. If a clustered artificial pin has been formed, this artificial pin is a third CARP. However, an example in which the third CARP has been formed only with MA=Y has not been confirmed. It seems that such a formation is difficult because of a large difference in an atomic radius between Y and Pr.

It was confirmed that the superconducting film 1FS-4% PrSm—Y—Lu had a characteristic equal to or lower than YBCO in a low magnetic field of 2 T or less, but the characteristic was increased at 3 T or more and was exceeded the characteristic of YBCO, and a difference therebetween was further increased at 5 T. This superconductor is on the basis of YBCO, but SmBCO and LuBCO are easily clustered. It is considered that PrBCO was formed in a part of a large unit cell of the cluster portion. Therefore, it seems that Pr was assembled in the cluster portion, the portion functioned as an artificial pin, and a magnetic field was thereby improved.

Also in the result of Jc-B measurement of the superconducting film 1FS-2% PrSm—Y—Lu, improvement of a magnetic field characteristic was confirmed. It is considered that SmBCO and LuBCO were clustered to form a structure in which PrBCO was incorporated into the cluster. However, the number of artificial pins should have become a half. In the result of measurement, an influence that the number became a half was not observed, and almost the same result of Jc-B measurement was obtained.

Among rare earth elements, only Pr becomes non-superconductive by forming a Perovskite structure. From comparison between the superconducting films 1FS-4% Pr—Y—Lu and 1FS-4% PrSm—Y—Lu including the same amount of Pr, it is clear that a magnetic field characteristic was improved by a distribution state of Pr. It is clear that a Perovskite structure was formed in each of the samples. Therefore, it was confirmed that a magnetic field characteristic was improved by uneven distribution of Pr, that is, a clustered artificial pin was formed.

When the amount of a substance added to a rare earth site of YBCO, other than Y was focused on, an effect of the clustered artificial pin was confirmed by comparison between the superconducting films 1FS-4% Pr—Y—Lu and 1FS-2% PrSm—Y—Lu. Each of the superconducting films contained a substance other than Y in an amount of 8%. However, a Jc-B characteristic of 1FS-2% PrSm—Y—Lu containing only 2% Pr was improved. Furthermore, a result comparing favorably with 1FS-4% PrSm—Y—Lu containing a pin in an amount twice of 1FS-2% PrSm—Y—Lu was obtained. It is considered that this is also one of evidences of forming the second CARP.

Example 2

First, three kinds of coating solutions for a superconductor were synthesized and purified according to the flowchart illustrated in FIG. 4. Powdery hydrates of $Pr(OCOCH_3)_3$, $Sm(OCOCH_3)_3$, $Y(OCOCH_3)_3$, $Lu(OCOCH_3)_3$, $Ba(OCOCH_3)_2$, and $Cu(OCOCH_3)_2$ as metal acetates were dissolved in ion exchange water at a metal ion molar ratio of 0.01:0.01:0.96:0.02:2:3, 0.02:0.02:0.92:0.04:2:3, or 0.04:0.04:0.84:0.08:2:3, were mixed with CFSCOOH in an equal reaction molar amount, and were stirred. Each of the resulting mixed solutions was put in an eggplant-shaped flask, and was subjected to a reaction and purification in a rotary evaporator under reduced pressure for 12 hours. Semitransparent blue substances 2Mi-1% PrSm—Y—Lu (substance described in Example 2, Y-based material with impurity), 2Mi-2% PrSm—Y—Lu, and 2Mi-4% PrSm—Y—Lu were obtained.

Each of the obtained semitransparent blue substances 2Mi-1% PrSm—Y—Lu, 2Mi-2% PrSm—Y—Lu, and 2Mi-4% PrSm—Y—Lu contained water or acetic acid as a byproduct of a reaction at the time of synthesis of a solution in an amount of about 7 wt %.

The obtained semitransparent blue substances 2Mi-1% PrSm—Y—Lu, 2Mi-2% PrSm—Y—Lu, and 2Mi-4% PrSm—Y—Lu were each completely dissolved in methanol having a weight about 100 times each of the substances (f in FIG. 4), and the solutions were subjected to a reaction and purification again in a rotary evaporator under reduced pressure for 12 hours to obtain semitransparent blue substances 2M-1% PrSm—Y—Lu (substance described in Example 2, Y-based material without impurity), 2M-2% PrSm—Y—Lu, and 2M-4% PrSm—Y—Lu, respectively.

The semitransparent blue substances 2M-1% PrSm—Y—Lu, 2M-2% PrSm—Y—Lu, and 2M-4% PrSm—Y—Lu were each dissolved in methanol (j in FIG. 4), and were diluted using a measuring flask to obtain 1.50 mol/l (in terms of a metal ion) coating solutions 2Cs-1% PrSm—Y—Lu (Example 2, coating solution for Y-based superconductor), 2Cs-2% PrSm—Y—Lu, and 2Cs-4% PrSm—Y—Lu, respectively.

A film was formed by using the coating solutions 2Cs-1% PrSm—Y—Lu, 2Cs-2% PrSm—Y—Lu, and 2Cs-4% PrSm—Y—Lu by a spin coating method at a maximum rotation number of 2000 rpm, calcining was performed in an atmosphere of pure oxygen at 400° C. or lower according to the profile illustrated in FIG. 6, firing was performed in a 1000 ppm oxygen-mixed argon gas at 800° C. according to the profile illustrated in FIG. 7, and annealing was performed in pure oxygen at 525° C. or lower to obtain superconducting films 2FS-1% PrSm—Y—Lu (Example 2, Y-based film of superconductor), 2FS-2% PrSm—Y—Lu, and 2FS-4% PrSm—Y—Lu, respectively.

The superconducting films 2FS-1% PrSm—Y—Lu, 2FS-2% PrSm—Y—Lu, and 2FS-4% PrSm—Y—Lu were measured by a 2θ/ω method in XRD measurement. For comparison, a YBCO film was compared therewith. FIG. 3A illustrates a result of XRD measurement (2θ/ω method) of YBCO and 2FS-4% PrSm—Y—Lu. As FIG. 3A indicates, a phase observed in 2FS-4% PrSm—Y—Lu is almost the same as a YBCO(00n) peak. A BaCu-based different phase is observed around 2θ=41.6 degrees. However, this is a very small peak because this graph is a logarithmic display. Therefore, it is no exaggeration to say that almost the same as a YBCO(00n) peak was observed.

For example, at 46.68 degrees as a YBCO(006) peak in FIG. 3A, 2FS-4% PrSm—Y—Lu has only one peak. This sample contained large amounts of cluster elements (4% Pr, 4% Sm, and 8% Lu). However, only one peak was observed in a 2θ/ω method in XRD measurement. In addition, from comparison with a YBCO film having the same thickness of 220 nm, a peak intensity was strong at almost the same level. The obtained result is not a result in which an intensity is dispersed around a central value, obtained by measuring a large amount of substances having uneven oriented layers, observed in measurement of a bulk body. It is clear that an intensity is observed only at a central value and that the peak intensity is obtained by contribution of almost all the unit cells to diffraction.

This result of XRD measurement indicates that 2FS-4% PrSm—Y—Lu forms a single Perovskite structure. A TEM observation result also indicates this. It can be determined that PrBCO, SmBCO, and LuBCO are continuously formed simultaneously in a Perovskite structure of YBCO.

In the graph of FIG. 3A, display for two or more samples makes it difficult to understand the graph by overlapping. Therefore, FIG. 3B illustrates a result of measurement for 2FS-1% PrSm—Y—Lu and 2FS-2% PrSm—Y—Lu by a 2θ/ω method in XRD measurement. As FIG. 3B indicates, the results of 2FS-1% PrSm—Y—Lu and 2FS-2% PrSm—Y—Lu were almost the same as 2FS-4% PrSm—Y—Lu.

As indicated by 46.68 degrees in FIG. 3B, each of 2FS-1% PrSm—Y—Lu and 2FS-2% PrSm—Y—Lu has one YBCO(006) peak. In such a clustered structure, particularly under a condition of PA+SA=CA, large and small unit cells form a cluster portion with a good balance, and therefore it is known that a particularly satisfactory Perovskite structure is formed and an intensity in XRD measurement is increased even at the same film thickness.

In the result of FIG. 3A, characteristics of Pr, Sm, and Lu are partially observed in the result of measurement of 2FS-4% PrSm—Y—Lu. In XRD measurement of YBCO, (003), (005), and (006) peaks appear strongly. However, peak intensities of (001), (003), and (006) in PrBCO, SmBCO, and LuBCO are strong. It is known experimentally and theoretically that an intermediate result thereof is obtained by mixing these. This is caused by the following. That is, a magnitude of a peak is determined by declination of an X-ray due to an element at the time of diffraction, and therefore when a Perovskite structure is maintained by mixing elements having different sizes, and an intermediate structure is formed only by the difference in the size, an intermediate value thereof is obtained.

In comparison between (001) and (006) peaks in FIG. 3A, a peak of 2FS-4% PrSm—Y—Lu is stronger than YBCO in the (001) peak. This is one of evidences of forming a Perovskite structure while a plurality of lanthanoid group elements such as Pr, Sm, or Lu are in a rare earth site.

The superconducting films 2FS-1% PrSm—Y—Lu, 2FS-2% PrSm—Y—Lu, and 2FS-4% PrSm—Y—Lu were each disposed in liquid nitrogen, and a superconducting characteristic thereof was measured under a self-magnetic field by an induction method. Jc values thereof were 6.2, 6.3, and 6.1 MA/cm$^2$ (77 K, 0 T), respectively. When PrBCO is ultimately dispersed, the superconducting films 2FS-1% PrSm—Y—Lu, 2FS-2% PrSm—Y—Lu, and 2FS-4% PrSm—Y—Lu should cause a 5 times degradation phenomenon. However, the above characteristic is not different from the Jc value of the original superconductor. It is considered that this is because PrBCO is assembled in one portion due to clustering to prevent large reduction of the Jc value.

Jc-B characteristics of the superconducting films 2FS-1% PrSm—Y—Lu, 2FS-2% PrSm—Y—Lu, and 2FS-4% PrSm—Y—Lu were measured at 77 K. FIG. 8 illustrates a result thereof. Jc-B characteristics of the superconducting films 2FS-1% PrSm—Y—Lu, 2FS-2% PrSm—Y—Lu, and 2FS-4% PrSm—Y—Lu were results of 1FS-1% PrSm—Y—Lu, 1FS-2% PrSm—Y—Lu, and 1FS-4% PrSm—Y—Lu. FIG. 8 also illustrates a result of Jc-B measurement of a YBCO film. The horizontal axis indicates a magnetic field (T), and the vertical axis indicates a Jc value (MA/cm$^2$).

FIG. 8 indicates that a significant effect does not appear at 2 T or less, but an effect starts to appear at a position exceeding 3 T, and a difference is becoming larger particularly at 5 T. 1FS-4% PrSm—Y—Lu containing 4% Pr particularly exhibits an effect of improvement of a magnetic field characteristic, and it was confirmed that an effect of an artificial pin was exhibited.

Example 3

First, three kinds of coating solutions for a superconductor were synthesized and purified according to the flowchart illustrated in FIG. 4. By using powdery hydrates of Pr(OCOCH$_3$)$_3$, Sm(OCOCH$_3$)$_3$, Y(OCOCH$_3$)$_3$, Lu(OCOCH$_3$)$_3$, Ba(OCOCH$_3$)$_2$, and Cu(OCOCH$_3$)$_2$ as metal acetates, solutions having the following metal ion molar ratios were prepared. A ratio of (Pr(OCOCH$_3$)$_3$+Sm(OCOCH$_3$)$_3$+Y (OCOCH$_3$)$_3$+Lu(OCOCH$_3$)$_3$):Ba(OCOCH$_3$)$_2$:Cu (OCOCH$_3$)$_2$ was fixed to 1:2:3. For example, in a solution containing Pr(OCOCH$_3$)$_3$ in an amount of 0.1 ppb, the contents of Sm(OCOCH$_3$)$_3$ and Lu(OCOCH$_3$) were 0.1 ppb and 0.2 ppb, respectively, and the content of Y(OCOCH$_3$)$_3$ is 0.9999999996 obtained by subtracting 0.4 ppb from 1.

In preparation for this sample, Pr(OCOCH$_3$)$_3$, Sm(OCOCH$_3$)$_3$, and Lu(OCOCH$_3$)$_3$ were dissolved in ion exchange water, were diluted a plurality of times so as to obtain a target concentration, and were mixed with a solution having Y(OCOCH$_3$) 3 dissolved. Therefore, the amount of Y cannot be controlled strictly. The control is performed at a level of 1.000±0.001. A ratio among Pr(OCOCH$_3$)$_3$, Sm(OCOCH$_3$)$_3$, and Lu(OCOCH$_3$)$_3$ in small amounts is controlled strictly to 0.1 ppb, 0.1 ppb, and 0.2 ppb. Therefore, it may be assumed that a relative ratio with respect to Y(OCOCH$_3$)$_3$ is controlled strictly.

The resulting mixed acetates were dissolved in ion exchange water, and were mixed with CF$_3$COOH in an equal reaction molar amount, and were stirred. The resulting mixed solution was put in an eggplant-shaped flask, and was subjected to a reaction and purification in a rotary evaporator under reduced pressure for 12 hours. A semitransparent blue substance 3Mi-0.1ppbPrSm—Y—Lu (substance described in Example 3, Y-based material with impurity) was obtained.

Solutions having different PrSmLu concentrations were prepared by the above method to obtain the following semitransparent blue substances. 3Mi-1ppbPrSm—Y—Lu, 3Mi-10ppbPrSm—Y—Lu, 3Mi-100ppbPrSm—Y—Lu, 3Mi-1ppmPrSm—Y—Lu, 3Mi-10ppmPrSm—Y—Lu, 3Mi-100ppmPrSm—Y—Lu, and 3Mi-1000ppmPrSm—Y—Lu were obtained.

Each of the obtained semitransparent blue substances 3Mi-0.1ppbPrSm—Y—Lu, 3Mi-1ppbPrSm—Y—Lu, 3Mi-10ppbPrSm—Y—Lu, 3Mi-100ppbPrSm—Y—Lu, 3Mi-1ppmPrSm—Y—Lu, 3Mi-10ppmPrSm—Y—Lu, 3Mi-100ppmPrSm—Y—Lu, and 3Mi-1000ppmPrSm—Y—Lu contained water or acetic acid as a byproduct of a reaction at the time of synthesis of a solution in an amount of about 7 wt %.

The obtained semitransparent blue substances 3Mi-0.1ppbPrSm—Y—Lu, 3Mi-1ppbPrSm—Y—Lu, 3Mi-10ppbPrSm—Y—Lu, 3Mi-100ppbPrSm—Y—Lu, 3Mi-1ppmPrSm—Y—Lu, 3Mi-10ppmPrSm—Y—Lu, 3Mi-100ppmPrSm—Y—Lu, and 3Mi-1000ppmPrSm—Y—Lu were each completely dissolved in methanol having a weight about 100 times each of the substances (f in FIG. 4), and the solutions were subjected to a reaction and purification again in a rotary evaporator under reduced pressure for 12 hours to obtain semitransparent blue substances 3M-0.1ppbPrSm—Y—Lu (substance described in Example 3, Y-based material without impurity), 3M-1ppbPrSm—Y—Lu, 3M-10ppbPrSm—Y—Lu, 3M-100ppbPrSm—Y—Lu, 3M-1ppmPrSm—Y—Lu, 3M-10ppmPrSm—Y—Lu, 3M-100ppmPrSm—Y—Lu, and 3M-1000ppmPrSm—Y—Lu, respectively.

The semitransparent blue substances 3M-0.1ppbPrSm—Y—Lu, 3M-1ppbPrSm—Y—Lu, 3M-10ppbPrSm—Y—Lu, 3M-100ppbPrSm—Y—Lu, 3M-1ppmPrSm—Y—Lu, 3M-10ppmPrSm—Y—Lu, 3M-100ppmPrSm—Y—Lu, and 3M-1000ppmPrSm—Y—Lu were each dissolved in methanol (j in FIG. 4), and were diluted using a measuring flask to obtain 1.50 mol/l (in terms of a metal ion) coating solutions 3Cs-0.1ppbPrSm—Y—Lu (Example 3, coating solution for Y-based superconductor), 3Cs-1ppbPrSm—Y—Lu, 3Cs-10ppbPrSm—Y—Lu, 3Cs-100ppbPrSm—Y—Lu, 3Cs-1ppmPrSm—Y—Lu, 3Cs-10ppmPrSm—Y—Lu, 3Cs-100ppmPrSm—Y—Lu, and 3Cs-1000ppmPrSm—Y—Lu, respectively.

A film was formed by using the coating solutions 3Cs-0.1ppbPrSm—Y—Lu, 3Cs-1ppbPrSm—Y—Lu, 3Cs-10ppbPrSm—Y—Lu, 3Cs-100ppbPrSm—Y—Lu, 3Cs-1ppmPrSm—Y—Lu, 3Cs-10ppmPrSm—Y—Lu, 3Cs-100ppmPrSm—Y—Lu, and 3Cs-1000ppmPrSm—Y—Lu by a spin coating method at a maximum rotation number of 2000 rpm, calcining was performed in an atmosphere of pure oxygen at 400° C. or lower according to the profile illustrated in FIG. 6, firing was performed in a 1000 ppm oxygen-mixed argon gas at 800° C. according to the profile illustrated in FIG. 7, and annealing was performed in pure oxygen at 525° C. or lower to obtain superconducting films 3FS-0.1ppbPrSm—Y—Lu (Example 3, Y-based film of superconductor), 3FS-1ppbPrSm—Y—Lu, 3FS-10ppbPrSm—Y—Lu, 3FS-100ppbPrSm—Y—Lu, 3FS-1ppmPrSm—Y—Lu, 3FS-10ppmPrSm—Y—Lu, 3FS-100ppmPrSm—Y—Lu, and 3FS-1000ppmPrSm—Y—Lu, respectively.

The superconducting films 3FS-0.1ppbPrSm—Y—Lu, 3FS-1ppbPrSm—Y—Lu, 3FS-10ppbPrSm—Y—Lu, 3FS-100ppbPrSm—Y—Lu, 3FS-1ppmPrSm—Y—Lu, 3FS-10ppmPrSm—Y—Lu, 3FS-100ppmPrSm—Y—Lu, and 3FS-1000ppmPrSm—Y—Lu were measured by a $2\theta/\omega$ method in XRD measurement, and it was confirmed that a peak was obtained at approximately the same position as a YBCO (00n) peak. This result indicates that PrBCO, SmBCO, and LuBCO have been formed in the same Perovskite structure as YBCO.

The superconducting films 3FS-0.1ppbPrSm—Y—Lu, 3FS-1ppbPrSm—Y—Lu, 3FS-10ppbPrSm—Y—Lu, 3FS-100ppbPrSm—Y—Lu, 3FS-1ppmPrSm—Y—Lu, 3FS-10ppmPrSm—Y—Lu, 3FS-100ppmPrSm—Y—Lu, and 3FS-1000ppmPrSm—Y—Lu were each disposed in liquid nitrogen, and a superconducting characteristic thereof was measured under a self-magnetic field by an induction method. Jc values thereof were 6.3, 6.4, 6.2, 6.3, 6.0, 6.2, 6.1, and 6.4 MA/cm$^2$ (77 K, 0 T), respectively. It is considered that the Jc values are within a measurement error range. In this system, the amount of a substance in the cluster portion is extremely small. Even 3FS-1000ppmPrSm—Y—Lu containing the cluster portion in a maximum amount contains only 0.4% cluster portion. Therefore, it is considered that a result as if obtained by measuring a YBCO film was obtained.

Jc-B characteristics of the superconducting films 3FS-0.1ppbPrSm—Y—Lu, 3FS-1ppbPrSm—Y—Lu, 3FS-10ppbPrSm—Y—Lu, 3FS-100ppbPrSm—Y—Lu, 3FS-1ppmPrSm—Y—Lu, 3FS-10ppmPrSm—Y—Lu, 3FS-100ppmPrSm—Y—Lu, and 3FS-1000ppmPrSm—Y—Lu were measured at 77 K. Here, Rj indicating the effect of improvement of a characteristic is defined as follows. A Jc value of YBCO at 77 K at 5 T is assumed to be 1, and a characteristic of a sample in the present Example at 77 K at 5 T is represented by a ratio. For example, when a Jc value is 1.61 times in a case of a Pr ratio of 1%, Rj=1.61 is obtained. FIG. 9 illustrates a result indicating a relation between a Pr concentration and Rj.

FIG. 9 indicates that an effect of improvement of a characteristic is exhibited even at 10 ppb. This amount is incredibly small. Usually, an artificial pin substance such as BZO is introduced into a superconductor formed by a physical deposition method in an amount of about 7.5% with respect to YBCO. The amount 10 ppb is extremely small with respect to this amount. It is considered that this is caused by a boundary of an artificial pin.

It is considered that an artificial pin generates a force to fix a magnetic flux by an energy difference between a site including a quantum magnetic flux and a site adjacent thereto, that is, a pin force. If so, it is estimated that a pin force of the BZO artificial pin is very weak.

In the BZO artificial pin, YBCO and BZO are present at a lattice size of about 9%. Therefore, a discontinuous surface is formed, and Tc is lowered in the portion to lower a potential as a superconducting state. In addition, it has been reported that the BZO artificial pin extracts an oxygen atom from a YBCO unit cell to lower Tc. In this case, a superconducting characteristic of YBCO is lowered. That is, in a structure in which the BZO artificial pin is introduced in a YBCO superconductor formed by a physical deposition method, a pin force is small inevitably.

On the other hand, it can be easily understood that an atom-replaced artificial pin has a high pin force. The atom-replaced artificial pin has a common Perovskite structure. In a process in which a part of PrBCO is cooled to a normal temperature, Pr becomes tetravalent to obtain a non-superconductive artificial pin. It is considered that a first adjacent cell thereof becomes non-superconductive by a 5 times degradation phenomenon but a second adjacent cell thereof is a superconductor having Tc slightly lowered. Therefore, a difference in a potential between a 5 times degradation portion and a superconducting portion is large, and a pin force becomes large.

The clustered artificial pin prepared this time is a second CARP having non-superconductivity of about 75% in a cluster portion. A pin force thereof is incomparably larger than that of a conventional BZO artificial pin, and therefore it is considered that an effect is exhibited by a small amount of 10 ppb. In the conventional BZO artificial pin, a potential is lowered at random in a portion around the artificial pin, and it is considered that countless paths for releasing a quantum magnetic flux are formed. It is considered that a pin force is thereby lowered.

On the other hand, the second CARP has a clear boundary from a superconductor. Therefore, it is considered that a magnetic flux can be captured even by a small amount of the artificial pin to exhibit an effect of improvement of a magnetic field characteristic. However, this improvement of a characteristic was performed mainly at 77 K, and therefore it is considered that it is necessary to form a cluster into a smaller size in order to exhibit an effect at a lower temperature.

There is no example of a report that an effect can be exhibited by such a small amount of an artificial pin in the past. It can be understood that the atom-replaced artificial pin is completely different from a conventional artificial pin. It has been found for the first time that the atom-replaced artificial pin exhibits an effect even in an incredibly small amount thereof. It is considered that a BZO artificial pin functions in a useless manner to reduce an effect rather than that the atom-replaced artificial pin exhibits an effect even in a small amount thereof.

Comparative Example

First, three kinds of coating solutions for a superconductor were synthesized and purified according to the flowchart illustrated in FIG. 4. By using powdery hydrates of Pr(OCOCH$_3$)$_3$, Sm(OCOCH$_3$)$_3$, Y(OCOCH$_3$)$_3$, Ba(OCOCH$_3$)$_2$, and Cu(OCOCH$_3$)$_2$ as metal acetates, solutions having the following metal ion molar ratios were prepared. A ratio of (Pr(OCOCH$_3$)$_3$+Sm(OCOCH$_3$)$_3$+Y(OCOCH$_3$)$_3$):Ba(OCOCH$_3$)$_2$:Cu(OCOCH$_3$)$_2$ was fixed to 1:2:3. Among the three acetates described first, a ratio between Pr(OCOCH$_3$)$_3$ and Sm(OCOCH$_3$)$_3$ was fixed to 1:1. For example, a solution containing Pr(OCOCH$_3$)$_3$ in an amount of 1 ppm was prepared. In this case, the content of Sm(OCOCH$_3$)$_3$ is also 1 ppm. The content of Y(OCOCH$_3$)$_3$ is obtained by subtracting 2 ppm from 1. That is, the content of Y(OCOCH$_3$)$_3$ is 0.999998.

In preparation for this sample, Pr(OCOCH$_3$)$_3$ and Sm(OCOCH$_3$)$_3$ were dissolved in ion exchange water, were diluted a plurality of times so as to obtain a target concentration, and were mixed with a solution having Y(OCOCH$_3$)$_3$ dissolved. Therefore, the amount of Y cannot be controlled strictly. The control is performed at a level of 1.000±0.001. A ratio between Pr(OCOCH$_3$)$_3$ and Sm(OCOCH$_3$)$_3$ in small amounts is controlled strictly to 1 ppm and 1 ppm. Therefore, it may be assumed that a relative ratio with respect to Y(OCOCH$_3$)$_3$ is controlled strictly.

The resulting mixed acetates were dissolved in ion exchange water, and were mixed with CF$_3$COOH in an equal reaction molar amount, and were stirred. The resulting mixed solution was put in an eggplant-shaped flask, and was subjected to a reaction and purification in a rotary evaporator under reduced pressure for 12 hours. A semitransparent blue substance 4Mi-1ppmPrSm—Y (substance described in Comparative Example, Y-based material with impurity) was obtained.

Solutions having different PrSm concentrations were prepared by the above method to obtain the following semitransparent blue substances. 4Mi-10ppmPrSm—Y and 4Mi-100ppmPrSm—Y were obtained. As described above, the content of an element of CA is zero.

Each of the obtained semitransparent blue substances 4Mi-1ppmPrSm—Y, 4Mi-10ppmPrSm—Y, and 4Mi-100ppmPrSm—Y contained water or acetic acid as a byproduct of a reaction at the time of synthesis of a solution in an amount of about 7 wt %.

The obtained semitransparent blue substances 4Mi-1ppmPrSm—Y, 4Mi-10ppmPrSm—Y, and 4Mi-100ppmPrSm—Y were each completely dissolved in methanol having a weight about 100 times each of the substances (f in FIG. 4), and the solutions were subjected to a reaction and purification again in a rotary evaporator under reduced pressure for 12 hours to obtain semitransparent blue substances 4M-1ppmPrSm—Y (substance described in Comparative Example, Y-based material without impurity), 4M-10ppmPrSm—Y, and 4M-100ppmPrSm—Y, respectively.

The semitransparent blue substances 4M-1ppmPrSm—Y, 4M-10ppmPrSm—Y, and 4M-100ppmPrSm—Y were each dissolved in methanol (j in FIG. 4), and were diluted using a measuring flask to obtain 1.50 mol/l (in terms of a metal ion) coating solutions 4Cs-1ppmPrSm—Y (Comparative Example, coating solution for Y-based superconductor), 4Cs-10ppmPrSm—Y, and 4Cs-100ppmPrSm—Y, respectively.

A film was formed by using the coating solutions 4Cs-1ppmPrSm—Y, 4Cs-10ppmPrSm—Y, and 4Cs-100ppmPrSm—Y by a spin coating method at a maximum rotation number of 2000 rpm, calcining was performed in an atmosphere of pure oxygen at 400° C. or lower according to the profile illustrated in FIG. 6, firing was performed in a 1000 ppm oxygen-mixed argon gas at 800° C. according to the profile illustrated in FIG. 7, and annealing was performed in pure oxygen at 525° C. or lower to obtain superconducting films 4FS-1ppmPrSm—Y (Comparative Example, Y-based film of superconductor), 4FS-10ppmPrSm—Y, and 4FS-100ppmPrSm—Y, respectively.

Measurement was performed for the superconducting films 4FS-1ppmPrSm—Y, 4FS-10ppmPrSm—Y, and 4FS-100ppmPrSm—Y by a 2θ/ω method in XRD measurement, and it was confirmed that a peak was obtained at almost the same position as a YBCO(00n) peak. This result indicates that PrBCO, SmBCO, and LuBCO have been formed in the same Perovskite structure as YBCO.

The superconducting films 4FS-1ppmPrSm—Y, 4FS-10ppmPrSm—Y, and 4FS-100ppmPrSm—Y were each disposed in liquid nitrogen, and a superconducting characteristic thereof was measured under a self-magnetic field by an induction method. Jc values thereof were 6.0, 5.9, and 5.7 MA/cm$^2$ (77 K, 0 T), respectively. It is considered that the Jc values are within a measurement error range although the characteristics are slightly low. In this system, the amount of a substance is extremely small in both a clustered portion and a non-clustered portion. Even 4FS-100ppmPrSm—Y containing the cluster portion in a maximum amount contains only 0.04% cluster portion. Therefore, it is considered that a result as if obtained by measuring a YBCO film was obtained.

Jc-B characteristics of the superconducting films 4FS-1ppmPrSm—Y, 4FS-10ppmPrSm—Y, and 4FS-100ppmPrSm—Y were measured at 77 K. Rj indicating a ratio of improvement of a characteristic were 0.53, 0.48, and 0.51 times, respectively. It is considered that this characteristic indicates that Pr or Sm did not function as an artificial pin.

The superconducting film 4FS-10ppmPrSm—Y is different from the superconducting film 3Cs-10ppmPrSm—Y—Lu in Example 3 in that 3Cs-10ppmPrSm—Y—Lu contains Lu in a larger amount than 4FS-10ppmPrSm—Y by 20 ppm. Strictly speaking, the content of Y is smaller by 20 ppm, but it is considered that there is little influence thereof. As a result, it has been found experimentally that a Jc-B characteristic is different therebetween at 77 K at 5 T by about four times.

The above result indicates that even when only Pr and Sm forming a large unit cell are present with respect to Y as a matrix phase, Pr and Sm are only dispersed ultimately, and do not form a cluster. In the TFA-MOD method, a superconductor unit cell is formed from a pseudo-liquid phase during firing. It is considered that shape anisotropy at this time has a large influence on growth to cause a clustering phenomenon. This result indicates that a cluster is not formed without Lu as a small unit cell in this clustering phenomenon and Pr is thereby not assembled either.

This result also suggest another fact. This experiment has clarified that Pr in an incredibly small amount 10 ppb exhibits an effect in clustering. Pr has a close atomic number to Sm. Therefore, a small amount of element should be contained by contamination almost all the time. However, also in this case, Lu having a largely different atomic number is not contained. If Lu is contained, Yb having a close atomic number thereto is contained in a larger amount, and Tm is contained in a still larger amount. Raw materials thereof may have been purified incompletely. If so, there is no effect of a high purity solution by the PS-SIG method, and it is considered that a random structure is formed inside. Therefore, Pr as PA, Sm as SA, and Lu as CA are not contained simultaneously in small amounts. It is considered that an effect has been confirmed for the first time as an artificial pin in which Pr as PA, Sm as SA, and Lu as CA are present simultaneously.

It is necessary to remove impurities in a solution as much as possible in order to introduce Pr into a Perovskite structure. This is because the same Perovskite structure is not formed due to presence of impurities. That is, ARP as an atom-replaced artificial pin is not formed. A group who made a trial by adjusting a high purity solution by the TFA-MOD in the past is limited. Unless an element located around both ends of rare earth elements is intentionally added to the high purity solution, CARP is not formed. Therefore, it is considered that a clustered atom-replaced artificial pin such as the second CARP was not formed unintentionally in formation of a superconductor in the past. It is considered that such an experiment or intention has not been reported so far.

Example 5

A coating solution for a superconductor was synthesized and purified according to the flowchart illustrated in FIG. 4. Powdery hydrates of $Pr(OCOCH_3)_3$, $Y(OCOCH_3)_3$, $Lu(OCOCH_3)_3$, $Ba(OCOCH_3)_2$, and $Cu(OCOCH_3)_2$ as metal acetates were dissolved in ion exchange water at a metal ion molar ratio of 0.04:0.92:0.04:2:3, were mixed with CFSCOOH in an equal reaction molar amount, and were stirred. The resulting mixed solution was put in an eggplant-shaped flask, and was subjected to a reaction and purification in a rotary evaporator under reduced pressure for 12 hours. A semitransparent blue substance 5Mi-4% Pr—Y—Lu (substance described in Example 5, Y-based material with impurity) was obtained.

Another coating solution for a superconductor was synthesized and purified by a similar operation to the above operation. Powdery hydrates of $Sm(OCOCH_3)_3$, $Y(OCOCH_3)_3$, $Lu(OCOCH_3)$ 3, $Ba(OCOCH_3)_2$, and $Cu(OCOCH_3)_2$ as metal acetates were dissolved in ion exchange water at a metal ion molar ratio of 0.04:0.92:0.04:2:3, were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. A semitransparent blue substance 5Mi-4% Sm—Y—Lu was obtained.

Each of the obtained semitransparent blue substances 5Mi-4% Pr—Y—Lu and 5Mi-4% Sm—Y—Lu contained water or acetic acid as a byproduct of a reaction at the time of synthesis of a solution in an amount of about 7 wt %.

The obtained semitransparent blue substances 5Mi-4% Pr—Y—Lu and 5Mi-4% Sm—Y—Lu were each completely dissolved in methanol having a weight about 100 times each of the substances (f in FIG. 4), and the solutions were subjected to a reaction and purification again in a rotary evaporator under reduced pressure for 12 hours to obtain semitransparent blue substances 5M-4% Pr—Y—Lu (substance described in Example 5, Y-based material without impurity) and 5M-4% Sm—Y—Lu, respectively.

The semitransparent blue substances 5M-4% Pr—Y—Lu and 5M-4% Sm—Y—Lu were each dissolved in methanol (j in FIG. 4), and were diluted using a measuring flask to obtain 1.50 mol/l (in terms of a metal ion) coating solutions 5Cs-4% Pr—Y—Lu (Example 5, coating solution for Y-based superconductor) and 5Cs-4% Sm—Y—Lu, respectively.

The coating solutions 5Cs-4% Pr—Y—Lu and 5Cs-4% Sm—Y—Lu were mixed with each other at a ratio of 0.5:3.5, 1:3, 2:2, or 3:1 to obtain coating solutions 5Cs-0.5% Pr3.5% Sm—Y—Lu, 5Cs-1% Pr3% Sm—Y—Lu, 5Cs-2% Pr2% Sm—Y—Lu, and 5Cs-3% Pr1% Sm—Y—Lu.

A film was formed by using the coating solutions 5Cs-4% Pr—Y—Lu, 5Cs-0.5% Pr3.5% Sm—Y—Lu, 5Cs-1% Pr3% Sm—Y—Lu, 5Cs-2% Pr2% Sm—Y—Lu, 5Cs-3% Pr1% Sm—Y—Lu, and 5Cs-4% Sm—Y—Lu by a spin coating method at a maximum rotation number of 2000 rpm, calcining was performed in an atmosphere of pure oxygen at 400° C. or lower according to the profile illustrated in FIG. 6, firing was performed in a 1000 ppm oxygen-mixed argon gas at 800° C. according to the profile illustrated in FIG. 7, and annealing was performed in pure oxygen at 525° C. or lower to obtain superconducting films 5FS-4% Pr—Y—Lu (Example 5, Y-based film of superconductor), 5FS-0.5% Pr3.5% Sm—Y—Lu, 5FS-1% Pr3% Sm—Y—Lu, 5FS-2% Pr2% Sm—Y—Lu, 5FS-3% Pr1% Sm—Y—Lu, and 5FS-4% Sm—Y—Lu, respectively.

The superconducting films 5FS-4% Pr—Y—Lu, 5FS-0.5% Pr3.5% Sm—Y—Lu, 5FS-1% Pr3% Sm—Y—Lu, 5FS-2% Pr2% Sm—Y—Lu, 5FS-3% Pr1% Sm—Y—Lu, and 5FS-4% Sm—Y—Lu were measured by a 2θ/ω method in XRD measurement, and it was confirmed that a peak was obtained at approximately the same position as a YBCO (00n) peak. This result indicates that PrBCO, SmBCO, and LuBCO have been formed in the same Perovskite structure as YBCO.

The superconducting films 5FS-4% Pr—Y—Lu, 5FS-0.5% Pr3.5% Sm—Y—Lu, 5FS-1% Pr3% Sm—Y—Lu, 5FS-2% Pr2% Sm—Y—Lu, 5FS-3% Pr1% Sm—Y—Lu, and 5FS-4% Sm—Y—Lu were each disposed in liquid nitrogen, and a superconducting characteristic thereof was measured under a self-magnetic field by an induction method. Jc values thereof were 5.4, 5.9, 6.4, 6.5, 6.4, and 6.5 $MA/cm^2$ (77 K, 0 T), respectively. FIG. 11 illustrates a result thereof.

In FIG. 11, the X-axis indicates the content of Pr (%), and the Y-axis indicates a Jc value of a superconductor. The content of Pr+Sm is 4% all the time. Therefore, for example, in a sample containing 2% Pr, the content of Sm is also 2%. For example, when the content of Pr is 3%, the content of Sm is 1%. A result in FIG. 11 indicates that the Jc value is maintained until the content of Pr is 2%, and a characteristic is lowered when the content of Pr is increased toward 4%.

In a sample containing 2% Pr, the content of Sm is also 2%, and the content of Lu is 4%. The content of PA+SA which are elements of a large unit cell capable of forming a cluster portion is 4%, and the content of CA is also 4%. If a complete cluster portion is formed in this state, clustering occurs at Pr:Sm:Lu=1:1:2. Even in the superconducting film 5FS-1% Pr3% Sm—Y—Lu containing 1% Pr, the Jc value is maintained at almost the same value. It can be easily estimated that this superconductor also forms a cluster portion.

On the other hand, it is found that a characteristic is degraded in the superconducting film 5FS-3% Pr1% Sm—Y—Lu containing 3% Pr and the superconducting film 5FS-4% Sm—Y—Lu containing 4% Pr. The superconducting film 5FS-3% Pr1% Sm—Y—Lu had the amount of degradation of about 10%, and the superconducting film 5FS-4% Sm—Y—Lu had the amount of degradation of about 20%.

Pr which has been ultimately dispersed without being incorporated into a cluster portion degrades the Jc value by 5 times in accordance with the amount thereof. When the Jc value is lowered by 10% in the superconducting film 5FS-3% Pr1% Sm—Y—Lu, Pr corresponding to 2% is ultimately dispersed. In this case, it is considered that Pr and Sm are incorporated into a cluster portion until reaching Pr:Sm=1:1, and excessive 2% Pr is ultimately dispersed to cause 5 times degradation of Jc.

On the other hand, lowering of the Jc value by 20% in the superconducting film 5FS-4% Sm—Y—Lu is a result observed as a 5 times degradation phenomenon. Therefore, it is imagined that Pr forms a ultimate dispersion structure without forming a cluster with Lu.

From the above result, it can be estimated that a cluster portion is formed until reaching Pr:Sm:Lu=1:1:2 in this system from macroscopic data. It is difficult to observe a structure of a cluster portion clearly and directly in analysis at present. However, it can be estimated that clustering actually occurs, and Pr is assembled in a cluster portion to form an artificial pin from Jc-B data.

Example 6

A coating solution for a superconductor was synthesized and purified according to the flowchart illustrated in FIG. 4. Powdery hydrates of $Pr(OCOCH_3)_3$, $Sm(OCOCH\_)_3$, $Y(OCOCH\_)_3$, $Lu(OCOCH_3)_3$, $Ba(OCOCH_3)_2$, and $Cu(OCOCH_3)_2$ as metal acetates were dissolved in ion exchange water at a metal ion molar ratio of 0.05:0.05:0.80:0.10:2:3, 0.07:0.07:0.72:0.14:2:3, 0.10:0.10:0.60:0.20:2:3, 0.13:0.13:0.48:0.26:2:3, or 0.16:0.16:0.36:0.32:2:3, were mixed with $CF_3COOH$ in an equal reaction molar amount, and were stirred.

Each of the resulting mixed solutions was put in an eggplant-shaped flask, and was subjected to a reaction and purification in a rotary evaporator under reduced pressure for 12 hours. Semitransparent blue substances 6Mi-5% PrSm—Y—Lu (substance described in Example 6, Y-based material with impurity), 6Mi-7% PrSm—Y—Lu, 6Mi-10% PrSm—Y—Lu, 6Mi-13% PrSm—Y—Lu, and 6Mi-16% PrSm—Y—Lu were obtained.

Each of the obtained semitransparent blue substances 6Mi-5% PrSm—Y—Lu, 6Mi-7% PrSm—Y—Lu, 6Mi-10% PrSm—Y—Lu, 6Mi-13% PrSm—Y—Lu, and 6Mi-16% PrSm—Y—Lu contained water or acetic acid as a byproduct of a reaction at the time of synthesis of a solution in an amount of about 7 wt %.

The obtained semitransparent blue substances 6Mi-5% PrSm—Y—Lu, 6Mi-7% PrSm—Y—Lu, 6Mi-10% PrSm—Y—Lu, 6Mi-13% PrSm—Y—Lu, and 6Mi-16% PrSm—Y—Lu were each completely dissolved in methanol having a weight about 100 times each of the substances (f in FIG. 4), and the solutions were subjected to a reaction and purification again in a rotary evaporator under reduced pressure for 12 hours to obtain semitransparent blue substances 6M-5% PrSm—Y—Lu (substance described in Example 6, Y-based material without impurity), 6M-7% PrSm—Y—Lu, 6M-10% PrSm—Y—Lu, 6M-13% PrSm—Y—Lu, and 6M-16% PrSm—Y—Lu, respectively.

The semitransparent blue substances 6M-5% PrSm—Y—Lu, 6M-7% PrSm—Y—Lu, 6M-10% PrSm—Y—Lu, 6M-13% PrSm—Y—Lu, and 6M-16% PrSm—Y—Lu were each dissolved in methanol (j in FIG. 4), and were diluted using a measuring flask to obtain 1.50 mol/l (in terms of a metal ion) coating solutions 6Cs-5% PrSm—Y—Lu (Example 6, coating solution for Y-based superconductor), 6Cs-7% PrSm—Y—Lu, 6Cs-10% PrSm—Y—Lu, 6Cs-13% PrSm—Y—Lu, and 6Cs-16% PrSm—Y—Lu, respectively.

A film was formed by using the coating solutions 6Cs-5% PrSm—Y—Lu, 6Cs-7% PrSm—Y—Lu, 6Cs-10% PrSm—Y—Lu, 6Cs-13% PrSm—Y—Lu, and 6Cs-16% PrSm—Y—Lu by a spin coating method at a maximum rotation number of 2000 rpm, calcining was performed in an atmosphere of pure oxygen at 400° C. or lower according to the profile illustrated in FIG. 6, firing was performed in a 1000 ppm oxygen-mixed argon gas at 800° C. according to the profile illustrated in FIG. 7, and annealing was performed in pure oxygen at 525° C. or lower to obtain superconducting films 6FS-5% PrSm—Y—Lu (Example 6, Y-based film of superconductor), 6FS-7% PrSm—Y—Lu, 6FS-10% PrSm—Y—Lu, 6FS-13% PrSm—Y—Lu, and 6FS-16% PrSm—Y—Lu, respectively.

The superconducting films 6FS-5% PrSm—Y—Lu, 6FS-7% PrSm—Y—Lu, 6FS-10% PrSm—Y—Lu, 6FS-13% PrSm—Y—Lu, and 6FS-16% PrSm—Y—Lu were measured by a 2θ/ω method in XRD measurement, and it was confirmed that a peak was obtained at approximately the same position as a YBCO (00n) peak. This result indicates that PrBCO, SmBCO, and LuBCO have been formed in the same Perovskite structure as YBCO. However, in the samples 6FS-13% PrSm—Y—Lu and 6FS-16% PrSm—Y—Lu each containing a matrix phase in a small amount, a slightly small value was obtained as a YBCO (00n) peak.

The superconducting films 6FS-5% PrSm—Y—Lu, 6FS-7% PrSm—Y—Lu, 6FS-10% PrSm—Y—Lu, 6FS-13% PrSm—Y—Lu, and 6FS-16% PrSm—Y—Lu were each disposed in liquid nitrogen, and a superconducting characteristic thereof was measured under a self-magnetic field by an induction method. Jc values thereof were 6.4, 6.2, 6.1, 5.5, and 2.8MA/cm$^2$ (77 K, 0 T), respectively. 6FS-13% PrSm—Y—Lu lowered a characteristic slightly, but an impression that 6FS-13% PrSm—Y—Lu formed a cluster portion in some way was given. However, the experimental result indicates a possibility that 6FS-16% PrSm—Y—Lu did not form an effective cluster.

Jc-B measurement for 6FS-5% PrSmLu, 6FS-7% PrSm—Y—Lu, 6FS-10% PrSm—Y—Lu, 6FS-13% PrSm—Y—Lu, 6FS-16% PrSm—Y—Lu was performed, and Rj indicating a characteristic improvement ratio was examined at 77 K at 5 T. A result thereof was 2.1, 1.9, 1.9, 1.5, and 0.3 in order. An effect was recognized in the samples containing Pr in an amount of 13% or less. However, a characteristic was deteriorated in the sample containing 16% Pr.

Example 7

A coating solution for a superconductor was synthesized and purified according to the flowchart illustrated in FIG. 4. By using powdery hydrates of $Pr(OCOCH_3)_3$, $Sm(OCOCH_3)_3$, $Dy(OCOCH_3)_3$, $Lu(OCOCH_3)_3$, $Ba(OCOCH_3)_2$, and $Cu(OCOCH_3)_2$ as metal acetates, mixing was performed so as to obtain the following metal ion molar ratios. (Pr+Sm+Dy+Lu):Ba:Cu=1:2:3 is satisfied. Pr:Sm:Lu=1:1:2 is satisfied. The content of Pr was 0.05, 0.07, 0.10, 0.13, or 0.16. For example, in a case of Pr=0.05, Pr:Sm:Dy:Lu:Ba:Cu=0.05:0.05:0.80:0.10:2:3 is satisfied.

The resulting mixed acetates were dissolved in ion exchange water, and were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours to obtain a semitransparent blue substance. A substance obtained in a case of Pr=0.05 is described as 7Mi-5% PrSmDyLu (substance described in Example 7, Dy-based material with impurity). Similarly, when the contents of Pr were 0.07, 0.10, 0.13, and 0.16, 7Mi-7% PrSmDyLu, 7Mi-10% PrSmDyLu, 7Mi-13% PrSmDyLu, and 7Mi-16% PrSmDyLu were obtained, respectively.

The above matrix phase was Dy. However, by using $Ho(OCOCH_3)_3$ in place of $Dy(OCOCH_3)_3$ and setting the contents of Pr to 0.05, 0.07, 0.10, 0.13, and 0.16, 7Mi-5% PrSmHoLu, 7Mi-7% PrSmHoLu, 7Mi-10% PrSmHoLu, 7Mi-13% PrSmHoLu, and 7Mi-16% PrSmHoLu were obtained, respectively.

In addition, a solution of Dy:Y=1:1 in place of Dy in the matrix phase was prepared. For example, in a case of Pr=0.05, Pr:Sm:Dy:Y:Lu:Ba:Cu=0.05:0.05:0.40:0.40:0.10:2:3 is satisfied. 7Mi-5% PrSm—DyY—Lu is obtained at this time. A case where MA is formed of Dy and Y in an equal amount is described as DyY here. Similarly, when the contents of Pr were 0.07, 0.10, 0.13, and 0.16, 7Mi-7% PrSm—DyY—Lu, 7Mi-10% PrSm—DyY—Lu, 7Mi-13% PrSm—DyY—Lu, and 7Mi-16% PrSm—DyY—Lu were obtained, respectively.

Each of the obtained semitransparent blue substances 7Mi-5% PrSm—Dy—Lu, 7Mi-7% PrSm—Dy—Lu, 7Mi-10% PrSm—Dy—Lu, 7Mi-13% PrSm—Dy—Lu, 7Mi-16% PrSm—Dy—Lu, 7Mi-5% PrSm—Ho—Lu, 7Mi-7% PrSm—Ho—Lu, 7Mi-10% PrSm—Ho—Lu, 7Mi-13% PrSm—Ho—Lu, 7Mi-16% PrSm—Ho—Lu, 7Mi-5% PrSm—DyY—Lu, 7Mi-7% PrSm—DyY—Lu, 7Mi-10% PrSm—DyY—Lu, 7Mi-13% PrSm—DyY—Lu, and 7Mi-16% PrSm—DyY—Lu contained water or acetic acid as a byproduct of a reaction at the time of synthesis of a solution in an amount of about 7 wt %.

The obtained semitransparent blue substances 7Mi-5% PrSmDyLu, 7Mi-7% PrSm—Dy—Lu, 7Mi-10% PrSm—Dy—Lu, 7Mi-13% PrSm—Dy—Lu, 7Mi-16% PrSm—Dy—Lu, 7Mi-5% PrSm—Ho—Lu, 7Mi-7% PrSm—Ho—Lu, 7Mi-10% PrSm—Ho—Lu, 7Mi-13% PrSm—Ho—Lu, 7Mi-16% PrSm—Ho—Lu, 7Mi-5% PrSm—DyY—Lu, 7Mi-7% PrSm—DyY—Lu, 7Mi-10% PrSm—DyY—Lu, 7Mi-13% PrSm—DyY—Lu, and 7Mi-16% PrSm—DyY—Lu were each completely dissolved in methanol having a weight about 100 times each of the substances (f in FIG. 4), and the solutions were subjected to a reaction and purification again in a rotary evaporator under reduced pressure for 12 hours to obtain semitransparent blue substances 7M-5% PrSm—Dy—Lu (substance described in Example 7, Y-based material without impurity), 7M-7% PrSm—Dy—Lu, 7M-10% PrSm—Dy—Lu, 7M-13% PrSm—Dy—Lu, 7M-16% PrSm—Dy—Lu, 7M-5% PrSm—Ho—Lu, 7M-7% PrSm—Ho—Lu, 7M-10% PrSm—Ho—Lu, 7M-13% PrSm—Ho—Lu, 7M-16% PrSm—Ho—Lu, 7M-5% PrSm—DyY—Lu, 7M-7% PrSm—DyY—Lu, 7M-10% PrSm—DyY—Lu, 7M-13% PrSm—DyY—Lu, and 7M-16% PrSm—DyY—Lu, respectively.

The semitransparent blue substances 7M-5% PrSm—Dy—Lu, 7M-7% PrSm—Dy—Lu, 7M-10% PrSm—Dy—Lu, 7M-13% PrSm—Dy—Lu, 7M-16% PrSm—Dy—Lu, 7M-5% PrSm—Ho—Lu, 7M-7% PrSm—Ho—Lu, 7M-10% PrSm—Ho—Lu, 7M-13% PrSm—Ho—Lu, 7M-16% PrSm—Ho—Lu, 7M-5% PrSm—DyY—Lu, 7M-7% PrSm—DyY—Lu, 7M-10% PrSm—DyY—Lu, 7M-13% PrSm—DyY—Lu, and 7M-16% PrSm—DyY—Lu were each dissolved in methanol (j in FIG. 4), and were diluted using a measuring flask to obtain 1.50 mol/l (in terms of a metal ion) coating solutions 7Cs-5% PrSm—Dy—Lu (Example 7, coating solution for Y-based superconductor), 7Cs-7% PrSm—Dy—Lu, 7Cs-10% PrSm—Dy—Lu, 7Cs-13% PrSm—Dy—Lu, 7Cs-16% PrSm—Dy—Lu, 7Cs-5% PrSm—Ho—Lu, 7Cs-7% PrSm—Ho—Lu, 7Cs-10% PrSm—Ho—Lu, 7Cs-13% PrSm—Ho—Lu, 7Cs-16% PrSm—Ho—Lu, 7Cs-5% PrSm—DyY—Lu, 7Cs-7% PrSm—DyY—Lu, 7Cs-10% PrSm—DyY—Lu, 7Cs-13% PrSm—DyY—Lu, and 7Cs-16% PrSm—DyY—Lu, respectively.

A film was formed by using the coating solutions 7Cs-5% PrSm—Dy—Lu, 7Cs-7% PrSm—Dy—Lu, 7Cs-10% PrSm—Dy—Lu, 7Cs-13% PrSm—Dy—Lu, 7Cs-16% PrSm—Dy—Lu, 7Cs-5% PrSm—Ho—Lu, 7Cs-7% PrSm—Ho—Lu, 7Cs-10% PrSm—Ho—Lu, 7Cs-13% PrSm—Ho—Lu, 7Cs-16% PrSm—Ho—Lu, 7Cs-5% PrSm—DyY—Lu, 7Cs-7% PrSm—DyY—Lu, 7Cs-10% PrSm—DyY—Lu, 7Cs-13% PrSm—DyY—Lu, and 7Cs-16% PrSm—DyY—Lu by a spin coating method at a maximum rotation number of 2000 rpm, calcining was performed in an atmosphere of pure oxygen at 400° C. or lower according to the profile illustrated in FIG. 6, firing was performed in a 1000 ppm oxygen-mixed argon gas at 800° C. according to the profile illustrated in FIG. 7, and annealing was performed in pure oxygen at 525° C. or lower to obtain superconducting films 7FS-5% PrSm—Dy—Lu (Example 7, Dy-based film of superconductor), 7FS-7% PrSm—Dy—Lu, 7FS-10% PrSm—Dy—Lu, 7FS-13% PrSm—Dy—Lu, 7FS-16% PrSm—Dy—Lu, 7FS-5% PrSm—Ho—Lu, 7FS-7% PrSm—Ho—Lu, 7FS-10% PrSm—Ho—Lu, 7FS-13% PrSm—Ho—Lu, 7FS-16% PrSm—Ho—Lu, 7FS-5% PrSm—DyY—Lu, 7FS-7% PrSm—DyY—Lu, 7FS-10% PrSm—DyY—Lu, 7FS-13% PrSm—DyY—Lu, and 7FS-16% PrSm—DyY—Lu, respectively.

The superconducting films 7FS-5% PrSm—Dy—Lu, 7FS-7% PrSm—Dy—Lu, 7FS-10% PrSm—Dy—Lu, 7FS-13% PrSm—Dy—Lu, 7FS-16% PrSm—Dy—Lu, 7FS-5% PrSm—Ho—Lu, 7FS-7% PrSm—Ho—Lu, 7FS-10% PrSm—Ho—Lu, 7FS-13% PrSm—Ho—Lu, 7FS-16% PrSm—Ho—Lu, 7FS-5% PrSm—DyY—Lu, 7FS-7% PrSm—DyY—Lu, 7FS-10% PrSm—DyY—Lu, 7FS-13% PrSm—DyY—Lu, and 7FS-16% PrSm—DyY—Lu were measured by a 2θ/ω method in XRD measurement, and it was confirmed that a peak was obtained at approximately the same position as a YBCO (00n) peak. This result indicates that PrBCO, SmBCO, and LuBCO have been formed in the same Perovskite structure as YBCO. However, in the samples 7FS-13% PrSm—Dy—Lu, 7FS-16% PrSm—Dy—Lu, 7FS-13% PrSm—Ho—Lu, 7FS-16% PrSm—Ho—Lu, 7FS-13% PrSm—DyY—Lu, and 7FS-16% PrSm—DyY—Lu each containing a matrix phase in a small amount, a slightly small value was obtained as a YBCO (00n) peak.

The superconducting films 7FS-5% PrSm—Dy—Lu, 7FS-7% PrSm—Dy—Lu, 7FS-10% PrSm—Dy—Lu, 7FS-13% PrSm—Dy—Lu, 7FS-16% PrSm—Dy—Lu, 7FS-5% PrSm—Ho—Lu, 7FS-7% PrSm—Ho—Lu, 7FS-10% PrSm—Ho—Lu, 7FS-13% PrSm—Ho—Lu, 7FS-16% PrSm—Ho—Lu, 7FS-5% PrSm—DyY—Lu, 7FS-7% PrSm—DyY—Lu, 7FS-10% PrSm—DyY—Lu, 7FS-13% PrSm—DyY—Lu, and 7FS-16% PrSm—DyY—Lu were each disposed in liquid nitrogen, and a superconducting characteristic thereof was measured under a self-magnetic field by an induction method. Jc values of the sample in which Pr=0.05, 0.07, or 0.10 was 5.8 to 6.5 MA/cm$^2$ (77 K, 0 T), a Jc value of the sample in which Pr=0.13 was 4.2 to 5.7 MA/cm$^2$ (77 K, 0 T), and a Jc value of the sample in which Pr=0.16 was 1.1 to 3.5 MA/cm$^2$ (77 K, 0 T).

Jc-B measurement for the superconducting films 7FS-5% PrSm—Dy—Lu, 7FS-7% PrSm—Dy—Lu, 7FS-10% PrSm—Dy—Lu, 7FS-13% PrSm—Dy—Lu, 7FS-16% PrSm—Dy—Lu, 7FS-5% PrSm—Ho—Lu, 7FS-7% PrSm—Ho—Lu, 7FS-10% PrSm—Ho—Lu, 7FS-13% PrSm—Ho—Lu, 7FS-16% PrSm—Ho—Lu, 7FS-5% PrSm—DyY—Lu, 7FS-7% PrSm—DyY—Lu, 7FS-10% PrSm—DyY—Lu, 7FS-13% PrSm—DyY—Lu, and 7FS-16% PrSm—DyY—Lu was performed. By assuming a characteristic of YBCO at 77 K at 5 T to be 1.0 time, it was examined how much an improvement effect was obtained. In the sample in which Pr=0.05, 0.07, or 0.10, a result of 1.7 to 2.3 times was obtained. In the sample in which Pr=0.13, a result of 1.2 to 1.6 times was obtained. In the sample in which Pr=0.16, a result of 0.050 to 0.40 times was obtained. An effect was recognized in the samples containing Pr in an amount of 13% or less. However, a characteristic was deteriorated in the sample containing 16% Pr.

In Example 6, the matrix phase was Y. In Example 7, the Y was replaced with Dy, Ho, or Dy+Y. There was no large difference therebetween in the Jc value or the Jc-B value. It has been found that even when replacement is performed with an element having an ionic radius close to Y, clustering is realized and a Pr artificial pin is clustered. It has been also found that a similar effect can be obtained by mixing these elements. Therefore, Y, Dy, Ho, or mixed elements thereof can be used for MA as a matrix phase element. A lowering tendency is observed by mixing Pr in an amount of 16%. Therefore, MA is required in a certain amount or more. It has been found that even in a case of mixture, clustering may occur by Y, Dy, and Ho occupying the most part of MA.

Example 8

First, three kinds of coating solutions for a superconductor were synthesized and purified according to the flowchart illustrated in FIG. 4. By using powdery hydrates of Pr(OCOCH$_3$)$_3$, an acetate of SA, Y(OCOCH$_3$)$_3$, Lu(OCOCH$_3$)$_3$, Ba(OCOCH$_3$)$_2$, and Cu(OCOCH$_3$)$_2$ as metal acetates, the metal acetates were mixed so as to obtain a metal ion molar ratio of 0.0025:0.0025:0.99:0.0050:2:3. SA is formed of Nd(OCOCH$_3$)$_3$, Sm(OCOCH$_3$)$_3$, Eu(OCOCH$_3$)$_3$, and Gd(OCOCH$_3$)$_3$. The following five kinds of compounds were prepared for SA. These were five kinds of compounds in total, a compound formed only of Nd(OCOCH$_3$)$_3$, a compound formed only of Eu(OCOCH$_3$)$_3$, a compound of Nd:Sm=1:1, a compound of Sm:Eu=1:1, and a compound of Sm:Gd=1:1 in terms of a metal ion ratio.

The above five kinds of mixed acetates were dissolved in ion exchange water, and were mixed with CF$_3$COOH in an equal reaction molar amount, and were stirred. The resulting mixed solution was put in an eggplant-shaped flask, and was subjected to a reaction and purification in a rotary evaporator under reduced pressure for 12 hours. Semitransparent blue substances 8Mi-0.25% PrNd—Y—Lu (substance described in Example 8, Y-based material with impurity), 8Mi-0.25% PrEu—Y—Lu, 8Mi-0.25% PrNdSm—Y—Lu, 8Mi-0.25% PrSmEu—Y—Lu, and 8Mi-0.25% PrSmGd—Y—Lu were obtained.

In this Example, SA includes two kinds of metals. When these metals are in an equal amount, the amount is omitted. Therefore, 8Mi-0.25% PrNdSm—Y—Lu indicates 0.25% Pr0.125% Nd0.125% Sm99%-Y-0.50% Lu. This indicates that PA=SA is satisfied, SA is Nd+Sm, and the contents thereof are equal to each other.

Each of the obtained semitransparent blue substances 8Mi-0.25% PrNd—Y—Lu, 8Mi-0.25% PrEu—Y—Lu, 8Mi-0.25% PrNdSm—Y—Lu, 8Mi-0.25% PrSmEu—Y—Lu, and 8Mi-0.25% PrSm—GdY—Lu contained water or acetic acid as a byproduct of a reaction at the time of synthesis of a solution in an amount of about 7 wt %.

The semitransparent blue substances 8Mi-0.25% PrNd—Y—Lu, 8Mi-0.25% PrEu—Y—Lu, 8Mi-0.25% PrNdSm—Y—Lu, 8Mi-0.25% PrSmEu—Y—Lu, and 8Mi-0.25% PrSmGd—Y—Lu were each completely dissolved in methanol having a weight about 100 times each of the substances (f in FIG. 4), and the solutions were subjected to a reaction and purification again in a rotary evaporator under reduced pressure for 12 hours to obtain semitransparent blue substances 8M-0.25% PrNd—Y—Lu (substance described in Example 8, Y-based material without impurity), 8M-0.25% PrEu—Y—Lu, 8M-0.25% PrNdSm—Y—Lu, 8M-0.25% PrSmEu—Y—Lu, and 8M-0.25% PrSm—GdY—Lu, respectively.

The semitransparent blue substances 8M-0.25% PrNd—Y—Lu, 8M-0.25% PrEu—Y—Lu, 8M-0.25% PrNdSm—Y—Lu, 8M-0.25% PrSmEu—Y—Lu, and 8M-0.25% PrSm—GdY—Lu were each dissolved in methanol (j in FIG. 4), and were diluted using a measuring flask to obtain 1.50 mol/l (in terms of a metal ion) coating solutions 8Cs-0.25% PrNd—Y—Lu (Example 8, coating solution for Y-based superconductor), 8Cs-0.25% PrEu—Y—Lu, 8Cs-0.25% PrNdSm—Y—Lu, 8Cs-0.25% PrSmEu—Y—Lu, and 8Cs-0.25% PrSm—GdY—Lu, respectively.

A film was formed by using the coating solutions 8Cs-0.25% PrNd—Y—Lu, 8Cs-0.25% PrEu—Y—Lu, 8Cs-0.25% PrNdSm—Y—Lu, 8Cs-0.25% PrSmEu—Y—Lu, and 8Cs-0.25% PrSm—GdY—Lu by a spin coating method at a maximum rotation number of 2000 rpm, calcining was performed in an atmosphere of pure oxygen at 400° C. or lower according to the profile illustrated in FIG. 6, firing was performed in a 1000 ppm oxygen-mixed argon gas at 800° C. according to the profile illustrated in FIG. 7, and annealing was performed in pure oxygen at 525° C. or lower to obtain superconducting films 8FS-0.25% PrNd—Y—Lu (Example 8, Y-based film of superconductor), 8FS-0.25% PrEu—Y—Lu, 8FS-0.25% PrNdSm—Y—Lu, 8FS-0.25% PrSmEu—Y—Lu, and 8FS-0.25% PrSm—GdY—Lu, respectively.

The superconducting films 8FS-0.25% PrNd—Y—Lu, 8FS-0.25% PrEu—Y—Lu, 8FS-0.25% PrNdSm—Y—Lu, 8FS-0.25% PrSmEu—Y—Lu, and 8FS-0.25% PrSm—GdY—Lu were measured by a 2θ/ω method in XRD measurement, and it was confirmed that a peak was obtained at approximately the same position as a YBCO (00n) peak. This result indicates that PrBCO, NdBCO, SmBCO, EuBCO, GdBCO, and LuBCO have been formed in the same Perovskite structure as YBCO.

The superconducting films 8FS-0.25% PrNd—Y—Lu, 8FS-0.25% PrEu—Y—Lu, 8FS-0.25% PrNdSm—Y—Lu, 8FS-0.25% PrSmEu—Y—Lu, and 8FS-0.25% PrSm—GdY—Lu were each disposed in nitrogen, and a superconducting characteristic thereof was measured under a self-magnetic field by an induction method. Jc values thereof were 6.5, 6.3, 6.4, 6.3, and 6.2 MA/cm$^2$ (77 K, 0 T), respectively. When PrBCO is ultimately dispersed, the superconducting films 8FS-0.25% PrNd—Y—Lu, 8FS-0.25% PrEu—Y—Lu, 8FS-0.25% PrNdSm—Y—Lu, 8FS-0.25% PrSmEu—Y—Lu, and 8FS-0.25% PrSm—GdY—Lu should cause a 5 times degradation phenomenon. However, the above characteristic is not different from the Jc value of the original superconductor. It is considered that this is because PrBCO is assembled in one portion due to clustering to prevent large reduction of the Jc value.

Jc-B characteristics of the superconducting films 8FS-0.25% PrNd—Y—Lu, 8FS-0.25% PrEu—Y—Lu, 8FS-0.25% PrNdSm—Y—Lu, 8FS-0.25% PrSmEu—Y—Lu, and 8FS-0.25% PrSm—GdY—Lu were measured at 77 K. Rj indicating a characteristic improvement ratio was examined at 77 K at 5 T. Rj values of the above superconducting films were 2.3, 2.1, 2.2, 2.0, and 1.8 times, respectively.

The satisfactory Jc values and the magnetic field characteristic improved at 77 K at 5 T indicate that Pr has been clustered and the clustered area has functioned as an artificial pin. SA has been on the basis of Sm. However, it has been found that a similar effect can be obtained by partially mixing Nd, Eu, and Gd having close atomic radii to one another.

Example 9

First, three kinds of coating solutions for a superconductor were synthesized and purified according to the flowchart illustrated in FIG. 4. By using powdery hydrates of $Pr(OCOCH_3)_3$, $Sm(OCOCH_3)_3$, $Y(OCOCH_3)_3$, an acetate of CA, $Ba(OCOCH_3)_2$, and $Cu(OCOCH_3)_2$ as metal acetates, the metal acetates were mixed so as to obtain a metal ion molar ratio of 0.0025:0.0025:0.99:0.0050:2:3. CA is formed of $Er(OCOCH_3)_3$, $Tm(OCOCH_3)_3$, $Yb(OCOCH_3)_3$, and $Lu(OCOCH_3)_3$. The following six kinds of compounds were prepared for CA. These were a compound formed only of $Er(OCOCH_3)_3$, a compound formed only of $Tm(OCOCH_3)_3$, a compound formed only of $Yb(OCOCH_3)_3$, a compound of Er:Yb=1:1, a compound of Tm:Yb=1:1, and a compound of Yb:Lu=1:1 in terms of a metal ion ratio.

The above six kinds of mixed acetates were dissolved in ion exchange water, and were mixed with $CF_3COOH$ in an equal reaction molar amount, and were stirred. The resulting mixed solution was put in an eggplant-shaped flask, and was subjected to a reaction and purification in a rotary evaporator under reduced pressure for 12 hours. Semitransparent blue substances 9Mi-0.25% PrSm—Y—Er (substance described in Example 9, Y-based material with impurity), 9Mi-0.25% PrSm—Y—Tm, 9Mi-0.25% PrSm—Y—Yb, 9Mi-0.25% PrSm—Y—ErTm, 9Mi-0.25% PrSm—Y—TmYb, and 9Mi-0.25% PrSm—Y—YbLu were obtained, respectively.

In this Example, a case where CA includes two kinds of elements such as Er and Tm in an equal amount is described as 9Mi-0.25% PrSm—Y—ErTm. That is, 9Mi-0.25% PrSm—Y—ErTm indicates 0.25% Pr0.25% Sm99%-Y-0.25% Er0.25% Tm.

Each of the obtained semitransparent blue substances 9Mi-0.25% PrSm—Y—Er, 9Mi-0.25% PrSm—Y—Tm, 9Mi-0.25% PrSm—Y—Yb, 9Mi-0.25% PrSm—Y—ErTm, 9Mi-0.25% PrSm—Y—TmYb, and 9Mi-0.25% PrSm—Y—YbLu contained water or acetic acid as a byproduct of a reaction at the time of synthesis of a solution in an amount of about 7 wt %.

The obtained semitransparent blue substances 9Mi-0.25% PrSm—Y—Er, 9Mi-0.25% PrSm—Y—Tm, 9Mi-0.25% PrSm—Y—Yb, 9Mi-0.25% PrSm—Y—ErTm, 9Mi-0.25% PrSm—Y—TmYb, and 9Mi-0.25% PrSm—Y—YbLu were each completely dissolved in methanol having a weight about 100 times each of the substances (f in FIG. 4), and the solutions were subjected to a reaction and purification again in a rotary evaporator under reduced pressure for 12 hours to obtain semitransparent blue substances 9M-0.25% PrSm—Y—Er (substance described in Example 9, Y-based material without impurity), 9M-0.25% PrSm—Y—Tm, 9M-0.25% PrSm—Y—Yb, 9M-0.25% PrSm—Y—ErTm, 9M-0.25% PrSm—Y—TmYb, and 9M-0.25% PrSm—Y—YbLu, respectively.

The semitransparent blue substances 9M-0.25% PrSm—Y—Er, 9M-0.25% PrSm—Y—Tm, 9M-0.25% PrSm—Y—Yb, 9M-0.25% PrSm—Y—ErTm, 9M-0.25% PrSm—Y—TmYb, and 9M-0.25% PrSm—Y—YbLu were each dissolved in methanol (j in FIG. 4), and were diluted using a measuring flask to obtain 1.50 mol/l (in terms of a metal ion) coating solutions 9Cs-0.25% PrSm—Y—Er (Example 8, coating solution for Y-based superconductor), 9Cs-0.25% PrSm—Y—Tm, 9Cs-0.25% PrSm—Y—Yb, 9Cs-0.25% PrSm—Y—ErTm, 9Cs-0.25% PrSm—Y—TmYb, and 9Cs-0.25% PrSm—Y—YbLu, respectively.

A film was formed by using the coating solutions 9Cs-0.25% PrSm—Y—Er, 9Cs-0.25% PrSm—Y—Tm, 9Cs-0.25% PrSm—Y—Yb, 9Cs-0.25% PrSm—Y—ErTm, 9Cs-0.25% PrSm—Y—TmYb, and 9Cs-0.25% PrSm—Y—YbLu by a spin coating method at a maximum rotation number of 2000 rpm, calcining was performed in an atmosphere of pure oxygen at 400° C. or lower according to the profile illustrated in FIG. 6, firing was performed in a 1000 ppm oxygen-mixed argon gas at 800° C. according to the profile illustrated in FIG. 7, and annealing was performed in pure oxygen at 525° C. or lower to obtain superconducting films 9FS-0.25% PrSm—Y—Er (Example 9, Y-based film of superconductor), 9FS-0.25% PrSm—Y—Tm, 9FS-0.25% PrSm—Y—Yb, 9FS-0.25% PrSm—Y—ErTm, 9FS-0.25% PrSm—Y—TmYb, and 9FS-0.25% PrSm—Y—YbLu, respectively.

The superconducting films 9FS-0.25% PrSm—Y—Er, 9FS-0.25% PrSm—Y—Tm, 9FS-0.25% PrSm—Y—Yb, 9FS-0.25% PrSm—Y—ErTm, 9FS-0.25% PrSm—Y—TmYb, and 9FS-0.25% PrSm—Y—YbLu were measured by a $2\theta/\omega$ method in XRD measurement, and it was confirmed that a peak was obtained at approximately the same position as a YBCO (00n) peak. This result indicates that PrBCO, SmBCO, ErBCO, TmBCO, YbBCO, and LuBCO have been formed in the same Perovskite structure as YBCO.

The superconducting films 9FS-0.25% PrSm—Y—Er, 9FS-0.25% PrSm—Y—Tm, 9FS-0.25% PrSm—Y—Yb, 9FS-0.25% PrSm—Y—ErTm, 9FS-0.25% PrSm—Y—TmYb, and 9FS-0.25% PrSm—Y—YbLu were each disposed in liquid nitrogen, and a superconducting characteristic thereof was measured under a self-magnetic field by an induction method. Jc values thereof were 6.3, 6.3, 6.1, 6.2, 6.2, 6.1, and 6.0 $MA/cm^2$ (77 K, 0 T), respectively. When PrBCO is ultimately dispersed, the superconducting films 9FS-0.25% PrSm—Y—Er, 9FS-0.25% PrSm—Y—Tm, 9FS-0.25% PrSm—Y—Yb, 9FS-0.25% PrSm—Y—ErTm, 9FS-0.25% PrSm—Y—TmYb, and 9FS-0.25% PrSm—Y—YbLu should cause a 5 times degradation phenomenon. However, the above characteristic is not different from the Jc value of the original superconductor. It is considered that this is because PrBCO is assembled in one portion due to clustering to prevent large reduction of the Jc value.

Jc-B characteristics of the superconducting films 9FS-0.25% PrSm—Y—Er, 9FS-0.25% PrSm—Y—Tm, 9FS-0.25% PrSm—Y—Yb, 9FS-0.25% PrSm—Y—ErTm, 9FS-0.25% PrSm—Y—TmYb, and 9FS-0.25% PrSm—Y—YbLu were measured at 77 K. Rj indicating a characteristic improvement ratio was examined at 77 K at 5 T. Rj values of the above superconducting films were 1.8, 1.7, 1.8, 1.6, 1.7, and 1.6 times, respectively.

The satisfactory Jc values and the magnetic field characteristic improved at 77 K at 5 T indicate that Pr has been clustered and the clustered area has functioned as an artificial pin. CA has been on the basis of Lu. However, it has been found that CA functions as an artificial pin by wholly or partially using Er, Tm, and Yb having close atomic radii to one another.

Example 10

First, three kinds of coating solutions for a superconductor were synthesized and purified according to the flowchart illustrated in FIG. 4. By using powdery hydrates of $Pr(OCOCH_3)_3$+$Sm(OCOCH_3)_3$, $Y(OCOCH_3)_3$, Lu(OCOCH$_3$)$_3$, Ba(OCOCH$_3$)$_2$, and Cu(OCOCH$_3$)$_2$ as metal acetates, the metal acetates were mixed so as to obtain a metal ion molar ratio of 0.0050:0.99:0.0050:2:3. As Pr(OCOCH$_3$)$_3$+Sm(OCOCH$_3$)$_3$, compounds having Pr/(Pr+Sm) of 0.05, 0.10, 0.20, 0.30, 0.50, 0.70, 0.80, 0.90, and 0.95 in terms of a metal ion ratio were prepared.

The above nine kinds of mixed acetates were dissolved in ion exchange water, and were mixed with CF$_3$COOH in an equal reaction molar amount, and were stirred. The resulting mixed solution was put in an eggplant-shaped flask, and was subjected to a reaction and purification in a rotary evaporator under reduced pressure for 12 hours. Semitransparent blue substances 10Mi-0.025% Pr0.475% Sm—Y—Lu (substance described in Example 10, Y-based material with impurity), 10Mi-0.05% Pr0.45% Sm—Y—Lu, 10Mi-0.1% Pr0.4% Sm—Y—Lu, 10Mi-0.15% Pr0.35% Sm—Y—Lu, 10Mi-0.25% Pr0.25% Sm—Y—Lu, 10Mi-0.35% Pr0.15% Sm—Y—Lu, 10Mi-0.4% Pr0.1% Sm—Y—Lu, 10Mi-0.45% Pr0.05% Sm—Y—Lu, and 10Mi-0.475% Pr0.025% Sm—Y—Lu were obtained, respectively.

Each of the obtained semitransparent blue substances 10Mi-0.025% Pr0.475% Sm—Y—Lu, 10Mi-0.05% Pr0.45% Sm—Y—Lu, 10Mi-0.1% Pr0.4% Sm—Y—Lu, 10Mi-0.15% Pr0.35% Sm—Y—Lu, 10Mi-0.25% Pr0.25% Sm—Y—Lu, 10Mi-0.35% Pr0.15% Sm—Y—Lu, 10Mi-0.4% Pr0.1% Sm—Y—Lu, 10Mi-0.45% Pr0.05% Sm—Y—Lu, and 10Mi-0.475% Pr0.025% Sm—Y—Lu contained water or acetic acid as a byproduct of a reaction at the time of synthesis of a solution in an amount of about 7 wt %.

The semitransparent blue substances 10Mi-0.025% Pr0.475% Sm—Y—Lu, 10Mi-0.05% Pr0.45% Sm—Y—Lu, 10Mi-0.1% Pr0.4% Sm—Y—Lu, 10Mi-0.15% Pr0.35% Sm—Y—Lu, 10Mi-0.25% Pr0.25% Sm—Y—Lu, 10Mi-0.35% Pr0.15% Sm—Y—Lu, 10Mi-0.4% Pr0.1% Sm—Y—Lu, 10Mi-0.45% Pr0.05% Sm—Y—Lu, and 10Mi-0.475% Pr0.025% Sm—Y—Lu were each completely dissolved in methanol having a weight about 100 times each of the substances (f in FIG. 4), and the solutions were subjected to a reaction and purification again in a rotary evaporator under reduced pressure for 12 hours to obtain semitransparent blue substances 10M-0.025% Pr0.475% Sm—Y—Lu (substance described in Example 10, Y-based material without impurity), 10M-0.05% Pr0.45% Sm—Y—Lu, 10M-0.1% Pr0.4% Sm—Y—Lu, 10M-0.15% Pr0.35% Sm—Y—Lu, 10M-0.25% Pr0.25% Sm—Y—Lu, 10M-0.35% Pr0.15% Sm—Y—Lu, 10M-0.4% Pr0.1% Sm—Y—Lu, 10M-0.45% Pr0.05% Sm—Y—Lu, and 10M-0.475% Pr0.025% Sm—Y—Lu, respectively.

The semitransparent blue substances 10M-0.025% Pr0.475% Sm—Y—Lu, 10M-0.05% Pr0.45% Sm—Y—Lu, 10M-0.1% Pr0.4% Sm—Y—Lu, 10M-0.15% Pr0.35% Sm—Y—Lu, 10M-0.25% Pr0.25% Sm—Y—Lu, 10M-0.35% Pr0.15% Sm—Y—Lu, 10M-0.4% Pr0.1% Sm—Y—Lu, 10M-0.45% Pr0.05% Sm—Y—Lu, and 10M-0.475% Pr0.025% Sm—Y—Lu were each dissolved in methanol (j in FIG. 4), and were diluted using a measuring flask to obtain 1.50 mol/l (in terms of a metal ion) coating solutions 10Cs-0.025% Pr0.475% Sm—Y—Lu (Example 10, coating solution for Y-based superconductor), 10Cs-0.05% Pr0.45% Sm—Y—Lu, 10Cs-0.1% Pr0.4% Sm—Y—Lu, 10Cs-0.15% Pr0.35% Sm—Y—Lu, 10Cs-0.25% Pr0.25% Sm—Y—Lu, 10Cs-0.35% Pr0.15% Sm—Y—Lu, 10Cs-0.4% Pr0.1% Sm—Y—Lu, 10Cs-0.45% Pr0.05% Sm—Y—Lu, and 10Cs-0.475% Pr0.025% Sm—Y—Lu, respectively.

A film was formed by using the coating solutions 10Cs-0.025% Pr0.475% Sm—Y—Lu, 10Cs-0.05% Pr0.45% Sm—Y—Lu, 10Cs-0.1% Pr0.4% Sm—Y—Lu, 10Cs-0.15% Pr0.35% Sm—Y—Lu, 10Cs-0.25% Pr0.25% Sm—Y—Lu, 10Cs-0.35% Pr0.15% Sm—Y—Lu, 10Cs-0.4% Pr0.1% Sm—Y—Lu, 10Cs-0.45% Pr0.05% Sm—Y—Lu, and 10Cs-0.475% Pr0.025% Sm—Y—Lu by a spin coating method at a maximum rotation number of 2000 rpm, calcining was performed in an atmosphere of pure oxygen at 400° C. or lower according to the profile illustrated in FIG. 6, firing was performed in a 1000 ppm oxygen-mixed argon gas at 800° C. according to the profile illustrated in FIG. 7, and annealing was performed in pure oxygen at 525° C. or lower to obtain superconducting films 10FS-0.025% Pr0.475% Sm—Y—Lu (Example 10, Y-based film of superconductor), 10FS-0.05% Pr0.45% Sm—Y—Lu, 10FS-0.1% Pr0.4% Sm—Y—Lu, 10FS-0.15% Pr0.35% Sm—Y—Lu, 10FS-0.25% Pr0.25% Sm—Y—Lu, 10FS-0.35% Pr0.15% Sm—Y—Lu, 10FS-0.4% Pr0.1% Sm—Y—Lu, 10FS-0.45% Pr0.05% Sm—Y—Lu, and 10FS-0.475% Pr0.025% Sm—Y—Lu, respectively.

The superconducting films 10FS-0.025% Pr0.475% Sm—Y—Lu, 10FS-0.05% Pr0.45% Sm—Y—Lu, 10FS-0.1% Pr0.4% Sm—Y—Lu, 10FS-0.15% Pr0.35% Sm—Y—Lu, 10FS-0.25% Pr0.25% Sm—Y—Lu, 10FS-0.35% Pr0.15% Sm—Y—Lu, 10FS-0.4% Pr0.1% Sm—Y—Lu, 10FS-0.45% Pr0.05% Sm—Y—Lu, and 10FS-0.475% Pr0.025% Sm—Y—Lu were measured by a 2θ/ω method in XRD measurement, and it was confirmed that a peak was obtained at approximately the same position as a YBCO (00n) peak. This result indicates that PrBCO, SmBCO, and LuBCO have been formed in the same Perovskite structure as YBCO.

The superconducting films 10FS-0.025% Pr0.475% Sm—Y—Lu, 10FS-0.05% Pr0.45% Sm—Y—Lu, 10FS-0.1% Pr0.4% Sm—Y—Lu, 10FS-0.15% Pr0.35% Sm—Y—Lu, 10FS-0.25% Pr0.25% Sm—Y—Lu, 10FS-0.35% Pr0.15% Sm—Y—Lu, 10FS-0.4% Pr0.1% Sm—Y—Lu, 10FS-0.45% Pr0.05% Sm—Y—Lu, and 10FS-0.475% Pr0.025% Sm—Y—Lu were each disposed in liquid nitrogen, and a superconducting characteristic thereof was measured under a self-magnetic field by an induction method. Jc values thereof were 6.4, 6.5, 6.3, 6.4, 6.4, 6.2, 5.9, 5.8, and 5.7 MA/cm$^2$ (77 K, 0 T), respectively. When PrBCO is ultimately dispersed, the superconducting films 10FS-0.025% Pr0.475% Sm—Y—Lu, 10FS-0.05% Pr0.45% Sm—Y—Lu, 10FS-0.1% Pr0.4% Sm—Y—Lu, 10FS-0.15% Pr0.35% Sm—Y—Lu, and 10FS-0.25% Pr0.25% Sm—Y—Lu should cause a 5 times degradation phenomenon. However, this phenomenon was not observed. It is considered that this is because PrBCO is assembled in one portion due to clustering to prevent large reduction of the Jc value. It has been found that a sample containing Pr in an amount of 5 to 50% corresponds thereto in a PA+SA site.

Each of 10FS-0.35% Pr0.15% Sm—Y—Lu, 10FS-0.4% Pr0.1% Sm—Y—Lu, 10FS-0.45% Pr0.05% Sm—Y—Lu, and 10FS-0.475% Pr0.025% Sm—Y—Lu contains a slightly large amount of Pr, and lowers a characteristic. Therefore, it is considered that excessive Pr is ultimately dispersed, leading to characteristic lowering. Each of these samples contains Pr in an amount of 70 to 95% in a PA+SA site.

Jc-B characteristics of the superconducting films 10FS-0.025% Pr0.475% Sm—Y—Lu, 10 FS-0.05% Pr0.45% Sm—Y—Lu, 10FS-0.1% Pr0.4% Sm—Y—Lu, 10FS-0.15% Pr0.35% Sm—Y—Lu, 10FS-0.25% Pr0.25% Sm—Y—Lu, 10 FS-0.35% Pr0.15% Sm—Y—Lu, 10FS-0.4% Pr0.1% Sm—Y—Lu, 10FS-0.45% Pr0.05% Sm—Y—Lu, and 10FS-0.475% Pr0.025% Sm—Y—Lu were measured at 77 K. Rj indicating a characteristic improvement ratio was examined at 77 K at 5 T. Rj values of the above superconducting films were 2.0, 2.1, 2.0, 1.9, 2.0, 2.1, 1.9, 2.0, 1.8, and 1.6 times, respectively.

By increase in the content of Pr, the degree of characteristic lowering is reduced. However, it is considered that by clustering only in a small amount, a large pin force is applied due to a clear boundary surface between a superconductor and a non-superconductor, and an effect of improvement of a magnetic field characteristic has been observed. It has been found that an effect of improvement of a magnetic field characteristic is observed in an entire examined region of Pr/(Pr+Sm) of 0.05 or more and 0.95 or less.

Example 11

First, three kinds of coating solutions for a superconductor were synthesized and purified according to the flowchart illustrated in FIG. 4. By using powdery hydrates of Pr(OCOCH$_3$)$_3$, Gd(OCOCH$_3$)$_3$, Y(OCOCH$_3$)$_3$, Yb(OCOCH$_3$)$_3$, Ba(OCOCH$_3$)$_2$, and Cu(OCOCH$_3$)$_2$ as metal acetates, solutions having the following metal ion molar ratios were prepared. A ratio of (Pr(OCOCH$_3$)$_3$+Gd(OCOCH$_3$)$_3$+Y(OCOCH$_3$)$_3$+Yb(OCOCH$_3$)$_3$):Ba(OCOCH$_3$)$_2$:Cu(OCOCH$_3$)$_2$ was fixed to 1:2:3. Pr is used for PA. Nothing is used for SA. Gd and Y are used for MA. Yb is used for CA.

In this system, the contents of Gd and Y occupying MA are equal to each other, and this is described as GdY. By mixing 0.5% Pr and 0.5% Yb, a mixed acetate was obtained. The above mixed acetate was dissolved in ion exchange water, and was mixed with CF$_3$COOH in an equal reaction molar amount, and was stirred. The resulting mixed solution was put in an eggplant-shaped flask, and was subjected to a reaction and purification in a rotary evaporator under reduced pressure for 12 hours. A semitransparent blue substance 11Mi-0.5% Pr—GdY—Yb (substance described in Example 11, Gd&Y-based material with impurity) was obtained.

Compounds obtained by mixing Er(OCOCH$_3$)$_3$, Tm(OCOCH$_3$)$_3$, Lu(OCOCH$_3$)$_3$, and a mixture of Yb(OCOCH$_3$)$_3$ and Lu(OCOCH$_3$)$_3$ at 1:1 in place of Yb(OCOCH$_3$)$_3$ by the above method were prepared to obtain 11Mi-0.5% Pr—GdY—Er, 11Mi-0.5% Pr—GdY—Tm, 11Mi-0.5% Pr—GdY—Lu, and 11Mi-0.5% Pr—GdY—YbLu, respectively. Here, 11Mi-0.5% Pr—GdY—YbLu indicates 0.5% Pr49.5% Gd49.5% Y0.25% Yb0.25% Lu.

Each of the obtained semitransparent blue substances 11Mi-0.5% Pr—GdY—Yb, 11Mi-0.5% Pr—GdY—Er, 11Mi-0.5% Pr—GdY—Tm, 11Mi-0.5% Pr—GdY—Lu, and 11Mi-0.5% Pr—GdY—YbLu contained water or acetic acid as a byproduct of a reaction at the time of synthesis of a solution in an amount of about 7 wt %.

The obtained semitransparent blue substances 11Mi-0.5% Pr—GdY—Yb, 11Mi-0.5% Pr—GdY—Er, 11Mi-0.5% Pr—GdY—Tm, 11Mi-0.5% Pr—GdY—Lu, and 11Mi-0.5% Pr—GdY—YbLu were each completely dissolved in methanol having a weight about 100 times each of the substances (f in FIG. 4), and the solutions were subjected to a reaction and purification again in a rotary evaporator under reduced pressure for 12 hours to obtain semitransparent blue substances 11M-0.5% Pr—GdY—Yb (substance described in Example 11, Y-based material without impurity), 11M-0.5% Pr—GdY—Er, 11M-0.5% Pr—GdY—Tm, 11M-0.5% Pr—GdY—Lu, and 11M-0.5% Pr—GdY—YbLu, respectively.

The semitransparent blue substances 11M-0.5% Pr—GdY—Yb, 11M-0.5% Pr—GdY—Er, 11M-0.5% Pr—GdY—Tm, 11M-0.5% Pr—GdY—Lu, and 11M-0.5% Pr—GdY—YbLu were each dissolved in methanol (j in FIG. 4), and were diluted using a measuring flask to obtain 1.50 mol/l (in terms of a metal ion) coating solutions 11Cs-0.5% Pr—GdY—Yb (Example 11, coating solution for Gd&Y-based superconductor), 11Cs-0.5% Pr—GdY—Er, 11Cs-0.5% Pr—GdY—Tm, 11Cs-0.5% Pr—GdY—Lu, and 11Cs-0.5% Pr—GdY—YbLu, respectively.

A film was formed by using the coating solutions 11Cs-0.5% Pr—GdY—Yb, 11Cs-0.5% Pr—GdY—Er, 11Cs-0.5% Pr—GdY—Tm, 11Cs-0.5% Pr—GdY—Lu, and 11Cs-0.5% Pr—GdY—YbLu by a spin coating method at a maximum rotation number of 2000 rpm, calcining was performed in an atmosphere of pure oxygen at 400° C. or lower according to the profile illustrated in FIG. 6, firing was performed in a 1000 ppm oxygen-mixed argon gas at 800° C. according to the profile illustrated in FIG. 7, and annealing was performed in pure oxygen at 525° C. or lower to obtain superconducting films 11FS-0.5% Pr—GdY—Yb (Example 11, Gd&Y-based film of superconductor), 11FS-0.5% Pr—GdY—Er, 11FS-0.5% Pr—GdY—Tm, 11FS-0.5% Pr—GdY—Lu, and 11FS-0.5% Pr—GdY—YbLu, respectively.

The superconducting films 11FS-0.5% Pr—GdY—Yb, 11FS-0.5% Pr—GdY—Er, 11FS-0.5% Pr—GdY—Tm, 11FS-0.5% Pr—GdY—Lu, and 11FS-0.5% Pr—GdY—YbLu were measured by a 2@/(method in XRD measurement, and it was confirmed that a peak was obtained at a position which seemed to be in the middle of a GdBCO(00n) peak and a YBCO(00n) peak. This result indicates that PrBCO, ErBCO, TmBCO, YbBCO, and LuBCO have been formed in a Perovskite structure having an average lattice constant of GdBCO and YBCO.

The superconducting films 11FS-0.5% Pr—GdY—Yb, 11FS-0.5% Pr—GdY—Er, 11FS-0.5% Pr—GdY—Tm, 11FS-0.5% Pr—GdY—Lu, and 11FS-0.5% Pr—GdY—YbLu were each disposed in liquid nitrogen, and a superconducting characteristic thereof was measured under a self-magnetic field by an induction method. Jc values thereof were 6.5, 6.4, 6.3, 6.4, and 6.3 MA/cm$^2$ (77 K, 0 T), respectively. It is considered that the Jc values indicate a satisfactory characteristic. In this system, the amount of a substance Pr is extremely small in both a clustered portion and a non-clustered portion. Even when a 5 times degradation phenomenon occurs, only 2.5% characteristic lowering is observed. Therefore, it is considered that a high characteristic has been obtained.

Jc-B characteristics of the superconducting films 11FS-0.5% Pr—GdY—Yb, 11FS-0.5% Pr—GdY—Er, 11FS-0.5% Pr—GdY—Tm, 11FS-0.5% Pr—GdY—Lu, and 11FS-0.5% Pr—GdY—YbLu were measured at 77 K. Rj values indicating a characteristic improvement ratio were examined at 77 K at 5 T, and were 1.53, 1.75, 1.67, 1.35, and 1.55 times, respectively. This was a slightly unstable result, but was a result by which functioning as an artificial pin can be determined.

In a case where only Y is used for MA, when Pr is used for PA and Tm or Lu is used for CA, it has been found experimentally that a Jc-B characteristic is not improved without clustering. It seems that the above result indicates that by mixing GdBCO with YBCO as a matrix phase, an average ionic radius of the matrix phase is increased, and a third generation type clustered atom-replaced artificial pin (third CARP) in which Pr, Yb, and the like are directly clustered has been formed consequently. It is considered that in the second CARP, a balance among PA+SA, MA, and CA determines whether clustering occurs or not, and a Jc-B characteristic is improved. An artificial pin is realized by PA, MA, and CA in the third CARP. However, it seems that the size of a matrix phase determines whether clustering occurs or not.

In addition, the above result indicates that an effect is exhibited even by mixing Gd and Y as MA. It has been confirmed that an effect is exhibited even by mixing Yb and Lu as CA. By mixing elements having sizes close to each other, an intermediate ionic radius thereof is obtained. During firing, a unit cell having a Perovskite structure is formed from a pseudo-liquid phase. It is considered that clustering occurs if conditions are complete.

It is considered that a balance among average ionic radii of MA, PA+SA, and CA is important for clustering in both the second CARP and the third CARP. By clustering, an effect of an artificial pin is obtained while a Perovskite structure is maintained, that is, the amount of IBC is small.

In the embodiments, the superconducting wire has been exemplified. However, the oxide superconductors of the present embodiments can be applied also to other applications such as a thin film on a single crystal substrate, requiring a high magnetic field characteristic.

While certain embodiments have been described, these embodiments have been presented by way of example only, and are not intended to limit the scope of the inventions. Indeed, the oxide superconductor and the method for manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for manufacturing an oxide superconductor, comprising:

preparing an aqueous solution including an acetate of a first element which is praseodymium (Pr), an acetate of at least one second element selected from the group consisting of neodymium (Nd), samarium (Sm), europium (Eu), and gadolinium (Gd), an acetate of at least one third element selected from the group consisting of yttrium (Y), terbium (Tb), dysprosium (Dy), and holmium (Ho), an acetate of at least one fourth element selected from the group consisting of erbium (Er), thulium (Tm), ytterbium (Yb), and lutetium (Lu), an acetate of barium (Ba), and an acetate of copper (Cu);

mixing the aqueous solution with a perfluorocarboxylic acid to prepare a mixed solution;

subjecting the mixed solution to a reaction and purification to prepare a first gel;

adding an alcohol including methanol to the first gel and dissolving the first gel therein to prepare an alcohol solution;

subjecting the alcohol solution to a reaction and purification to prepare a second gel;

adding an alcohol including methanol to the second gel and dissolving the second gel therein to prepare a coating solution in which a total weight of residual water and residual acetic acid is 2% by weight or less;

applying the coating solution on a substrate to form a gel film;

subjecting the gel film to calcining at 400° C. or lower to form a calcined film; and subjecting the calcined film to firing under a humidified atmosphere at 725° C. or higher and 850° C. or lower and oxygen annealing to form an oxide superconductor layer.

2. The method according to claim 1, wherein content by percentage of the trifluoroacetic acid in the perfluorocarboxylic acid is 98 mol % or more.

* * * * *